US006551862B2

(12) United States Patent
Oota et al.

(10) Patent No.: US 6,551,862 B2
(45) Date of Patent: Apr. 22, 2003

(54) SEMICONDUCTOR DEVICE AND METHOD OF MANUFACTURING THE SAME

(75) Inventors: Riyouichi Oota, Nanae (JP); Tsugihiko Hirano, Hakodate (JP); Atsushi Fujisawa, Hakodate (JP); Takafumi Konno, Hakodate (JP)

(73) Assignees: Hitachi, Ltd., Tokyo (JP); Hitachi Hokkai Semiconductor, Ltd., Hokkaido (JP)

( * ) Notice: Subject to any disclaimer, the term of this patent is extended or adjusted under 35 U.S.C. 154(b) by 0 days.

(21) Appl. No.: 09/978,724

(22) Filed: Oct. 18, 2001

(65) Prior Publication Data

US 2002/0050642 A1 May 2, 2002

(30) Foreign Application Priority Data

Nov. 2, 2000 (JP) ........................................ 2000-335839

(51) Int. Cl.[7] .............................................. H01L 21/50
(52) U.S. Cl. ........................ 438/118; 438/127; 438/114; 438/125
(58) Field of Search ........................ 438/113–114, 118, 438/125–127, 26, 33, 51, 53, 55, 458, 464, 476, FOR 386, FOR 387, FOR 438; 257/701, 724

(56) References Cited

U.S. PATENT DOCUMENTS 5,241,133 A * 8/1993 Mullen et al. .............. 174/52.2
5,886,949 A * 3/1999 Villa et al. .................. 365/194

FOREIGN PATENT DOCUMENTS

| JP | 61112345 A | * 5/1986 | .......... H01L/21/78 |
| JP | 11-224912 | 8/1999 | |
| JP | 2000-114424 | 4/2000 | |

* cited by examiner

Primary Examiner—Wael Fahmy
Assistant Examiner—Thanh V Pham
(74) Attorney, Agent, or Firm—Mattingly, Stanger & Malur, P.C.

(57) ABSTRACT

A semiconductor device is disclosed, comprising a tape substrate which supports a semiconductor chip, an insulating adhesive layer disposed between the semiconductor chip and the tape substrate, an insulating sheet member laminated to the insulating adhesive layer and formed harder than the insulating adhesive layer, wires for connecting pads on the semiconductor chip with connecting terminals on the tape substrate, a sealing portion formed by sealing the semiconductor chip with resin, and plural solder balls provided on a back of the tape substrate. A die bonding layer for fixing the semiconductor chip thereto is composed of an insulating adhesive layer and the insulating sheet member laminated thereto. The die bonding layer is formed thick by such a multi-layer structure, whereby the resin balance of the surface and back of the semiconductor chip is improved to prevent warping of a package and improve the mounting temperature cyclicity and reflow characteristic.

11 Claims, 15 Drawing Sheets

FIG. 11
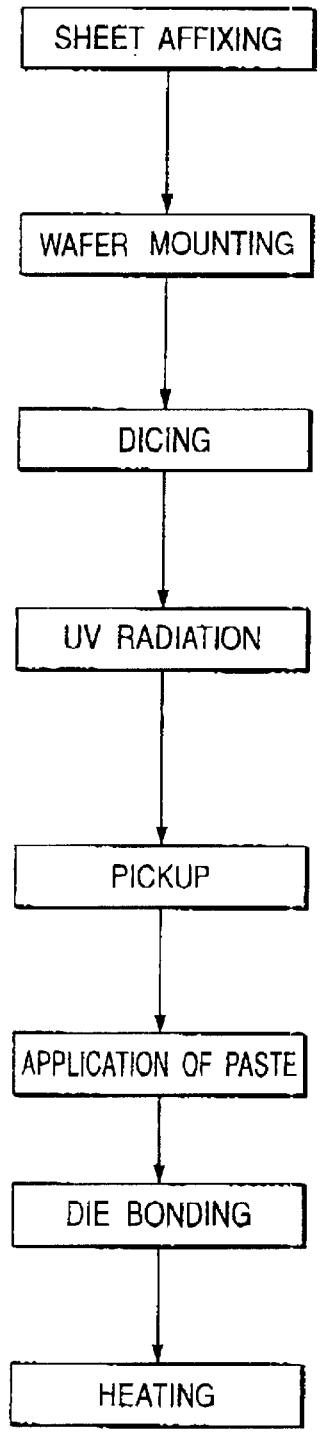
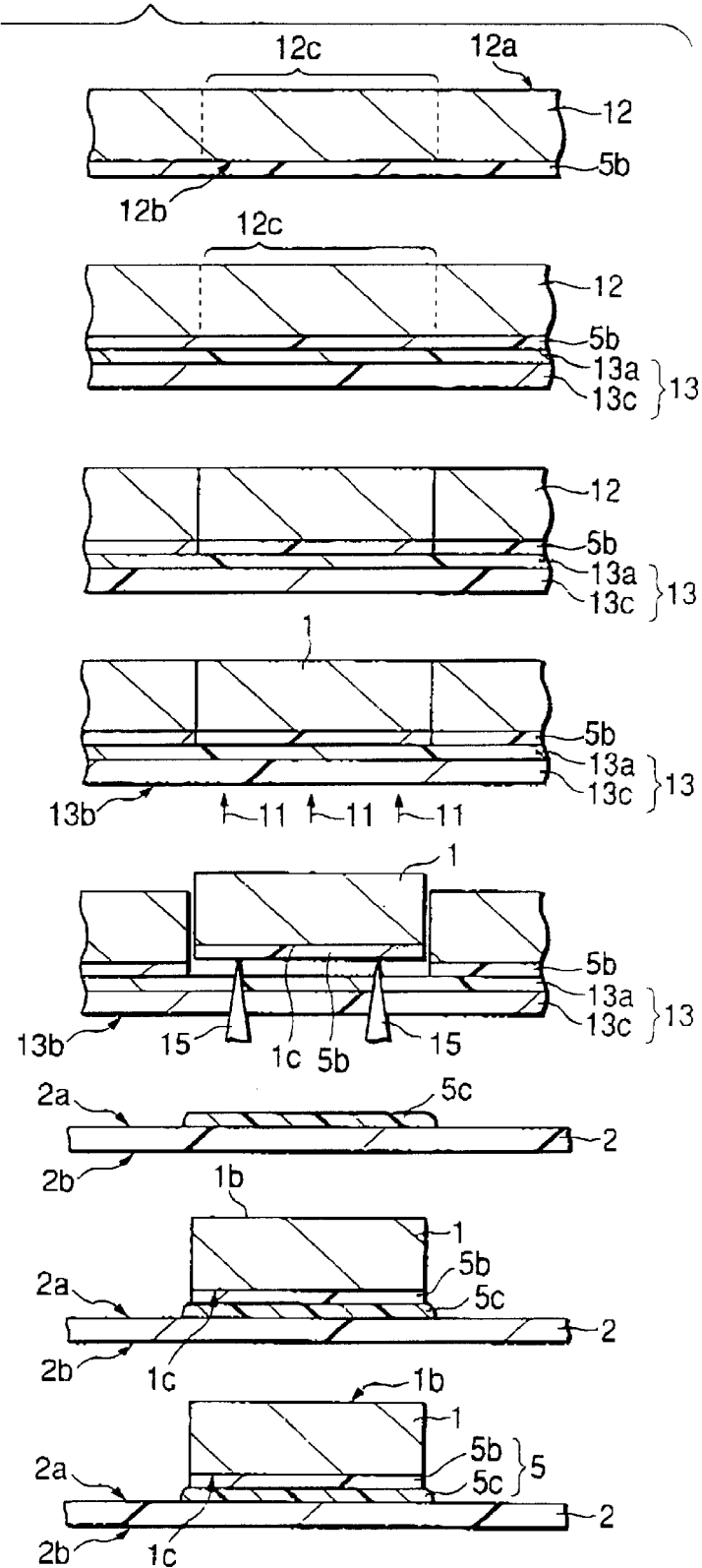

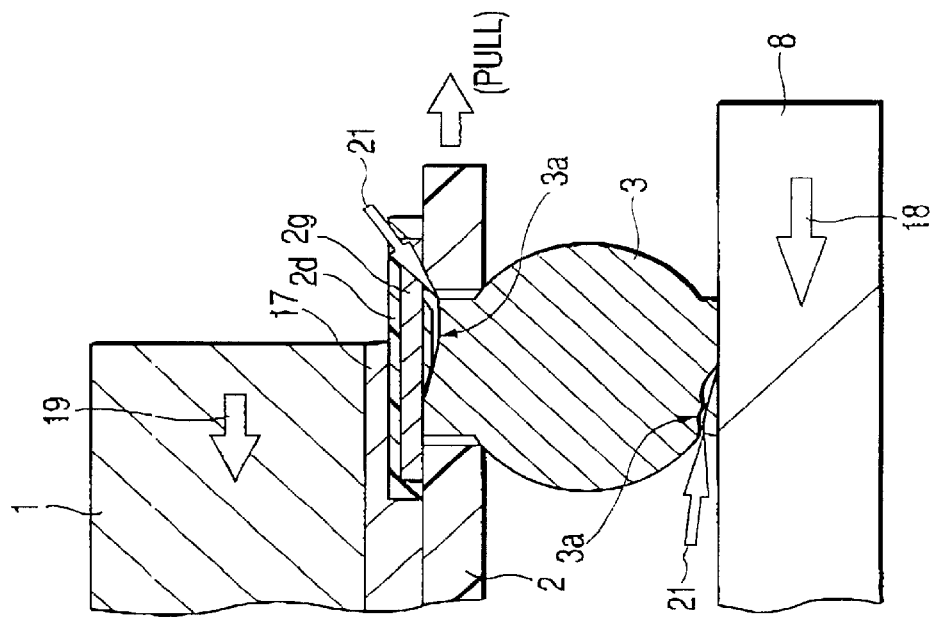
FIG. 17(a) ⟨BEFORE BREAKAGE⟩
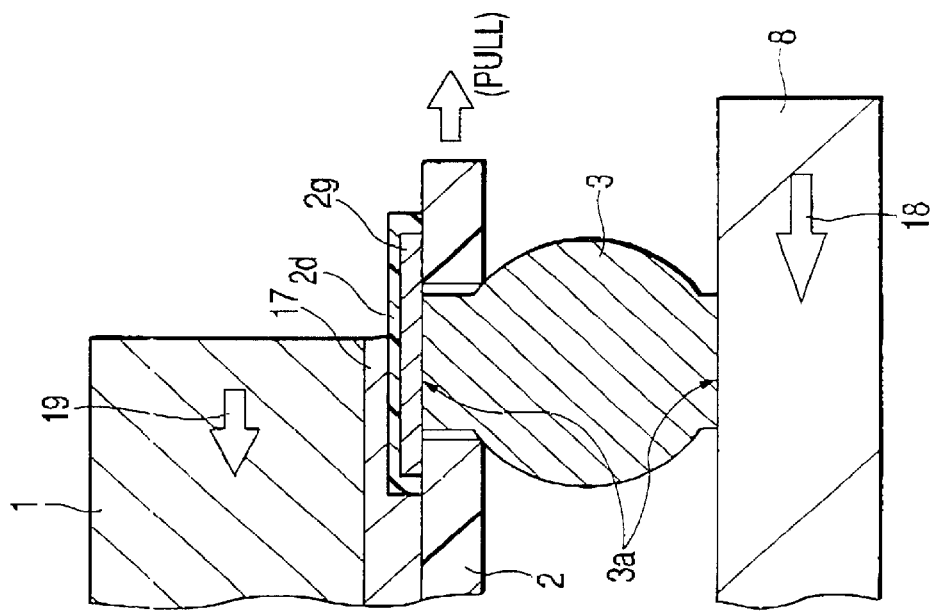
FIG. 17(b) ⟨AFTER BREAKAGE⟩

SEMICONDUCTOR DEVICE AND METHOD OF MANUFACTURING THE SAME

BACKGROUND OF THE INVENTION

The present invention relates to a semiconductor device manufacturing technique and more particularly to a technique which is effective in its application to the improvement of mounting temperature cyclicity, reflow characteristic and mounting performance of a semiconductor device.

As an example of a semiconductor device (semiconductor package) having a semiconductor chip with a semiconductor integrated circuit formed thereon, further having bump electrodes (solder balls) as external terminals and a chip supporting substrate for supporting the semiconductor chip, there is known a semiconductor device called BGA (Ball Grid Array).

In a certain type of a BGA intended for the reduction of wall thickness there is used a tape substrate (wiring board) as a semiconductor chip supporting substrate.

In assembling the BGA, a semiconductor chip is mounted on one side, i.e., a chip supporting surface, of the tape substrate with use of an insulating adhesive, and after wire bonding, sealing is performed with resin to form a sealing portion.

Further, at the back of the tape substrate, solder balls (external terminals) are mounted on bump lands as external terminal mounting electrodes (a solder paste may be printed and thereafter melted by reflow for example).

Therefore, in the case of a BGA of a structure wherein solder balls are arranged in both inside and outside areas of a semiconductor chip, a stress is apt to be imposed on a bonded portion of the solder balls arranged near a peripheral edge of the semiconductor chip due to a difference in thermal expansion coefficient among the semiconductor chip, tape substrate, and mounting substrate.

As a technique for relieving stress between a semiconductor chip and a chip supporting substrate there is described in Japanese Unexamined Patent Publication No. 2000-114424 a technique wherein a relatively hard adhesive layer is disposed on a substrate side (lower side) between a semiconductor chip and a chip supporting substrate and a layer lower in Young's modulus than the adhesive layer is disposed on the chip side (upper side) which overlies the adhesive.

In Japanese Unexamined Patent Publication No. Hei 11(1999)-224912 there is described a technique wherein a tent-like tension is ensured by a layer of a high elastic modulus at the time of bonding to a wiring board while maintaining a stress relieving structure with use of a layer of a low elastic modulus, thereby utilizing a space surrounded by wiring lines, wiring board and the high elastic modulus layer as a vent line to ensure an anti-package crack characteristic.

SUMMARY OF THE INVENTION

However, in the semiconductor package described in the above Japanese Unexamined Patent Publication No. 2000-114424, a hard adhesive layer is disposed on the lower side (substrate side) between the semiconductor chip and the chip supporting substrate and a layer of a low Young s modulus is disposed on the upper side (chip side), so when pressure based on a resin injection pressure in resin molding is applied to the semiconductor chip from above, the chip sinks and buckles, with consequent occurrence of a chip crack.

In the publication in question, moreover, there is found no description about an air vent portion for the escape of inside air to the outside. Even if an air vent portion is formed in the chip supporting substrate, air is difficult to escape to the exterior because a hard adhesive layer is disposed on the lower side. Therefore, the internal pressure of the package rises due to steam and outgas generated by heat treatment at the time of mounting the semiconductor device onto the mounting substrate, such as reflow of solder bumps, so that defects such as package crack, peeling, swelling, and popcorn phenomenon are apt to occur, thus giving rise to the problem that the reliability (reflow characteristic) in reflow (mounting) is poor.

According to a semiconductor package described in Japanese Unexamined Patent Publication No. Hei 11(1999)-224912, the foregoing vent line has a tubular structure larger in diameter than a filler (to 3 $\mu$m) contained in the sealing resin for example, thus allowing the molding resin to get into the vent line at the time of resin sealing. Once the molding resin gets into the vent line, not only the vent line loses its venting function, but also there is a fear that an unfilled area may remain in the resin in the course of the molding resin getting into the vent line which is complicated in structure. Such an unfilled area left in the resin rises in its internal pressure at the time of reflow, which can cause a popcorn phenomenon.

In the case of a BGA using a tape substrate as a chip supporting substrate, there occurs a warp of a package due to shrinkage during curing of a molding resin which is attributable to a difference in thermal expansion coefficient among the molding resin, a semiconductor chip and the tape substrate or insufficient rigidity of the tape substrate.

The resulting deterioration of the mounting performance poses a problem.

Further, stress is apt to concentrate in bonded portions on the package side and the mounting substrate side of solder balls arranged near a peripheral edge portion of the semiconductor chip, thus giving rise to the problem that there occurs a defective connection in a mounting temperature cycle test.

It is an object of the present invention to provide a semiconductor device and a method of manufacturing the same, which can improve the mounting temperature cyclicity.

It is another object of the present invention to provide a semiconductor device and a method of manufacturing the same, which can improve the reflow characteristic.

It is a further object of the present invention to provide a semiconductor device and a method of manufacturing the same, which can improve the mounting performance.

The above and other objects and novel features of the present invention will become apparent from the following description and the accompanying drawings.

An outline will be given below of typical inventions out of those disclosed herein.

In one aspect of the present invention there is provided a semiconductor device comprising a wiring board, a semiconductor chip disposed on the wiring board, an insulating, first layer disposed between the semiconductor chip and the wiring board, an insulating, second layer disposed between the semiconductor chip and the first layer and formed harder than the first layer, a conductive member for connecting a surface electrode on the semiconductor chip with a corresponding connecting terminal on the wiring board, a sealing portion formed by sealing the semiconductor chip and the conductive member with resin, and a plurality of external terminals disposed on the side opposite to a chip supporting surface of the wiring board.

According to this construction, an insulating die bonding layer composed of the first and second layers between the semiconductor chip and the wiring board can be made thick easily.

Therefore, it is possible to improve the resin balance between the surface and the back of the semiconductor chip. As a result, it is possible to diminish a difference in shrinkage factor among the chip sealing portion on the semiconductor chip, the semiconductor chip, the die bonding layer, and the mounting substrate.

Further, since it is possible to thicken the insulating die bonding layer composed of the first and second layers on the back side of the semiconductor chip, it is possible to diminish the concentration of stress in package-side bonded portions of bump electrodes and mounting substrate-side bonded portions thereof, whereby it is possible to diminish defective connections of bump electrodes in temperature cycle.

Consequently, it is possible to improve the mounting temperature cyclicity (life).

In another aspect of the present invention there is provided a semiconductor device comprising a wiring board, a semiconductor chip disposed on the wiring board, a porous layer as an insulating, first layer disposed between the semiconductor chip and the wiring board, an insulating, second layer disposed between the semiconductor chip and the porous layer, a conductive member for connecting a surface electrode on the semiconductor chip with a corresponding connecting terminal on the wiring board, a sealing portion formed by sealing the semiconductor chip and the conductive member with resin, and a plurality of external terminals disposed on the side opposite to a chip supporting surface of the wiring board.

In a further aspect of the present invention there is provided a semiconductor device comprising a wiring board, a semiconductor chip disposed on the wiring board, a porous layer as an insulating, first layer disposed between the semiconductor chip and the wiring board, an insulating, second layer disposed between the semiconductor chip and the porous layer and formed harder than the porous layer, a conductive member for connecting a surface electrode on the semiconductor chip with a corresponding connecting terminal on the wiring board, a sealing portion formed by sealing the semiconductor chip and the conductive member with resin, and a plurality of external terminals disposed on the side opposite to a chip supporting surface of the wiring board.

In a still further aspect of the present invention there is provided a semiconductor device comprising a wiring board, a semiconductor chip disposed on the wiring board, an insulating, first layer disposed between the semiconductor chip and the wiring board, an insulating, second layer disposed between the semiconductor chip and the first layer, a conductive member for connecting a surface electrode on the semiconductor chip with a corresponding connecting terminal on the wiring board, a sealing portion formed by sealing the semiconductor chip and the conductive member with resin, and a plurality of external terminals disposed on the side opposite to a chip supporting surface of the wiring board, the first layer having a water permeability higher than that of the second layer.

In a still further aspect of the present invention there is provided a semiconductor device comprising a wiring board, a semiconductor chip disposed on the wiring board, an insulating, first layer disposed between the semiconductor chip and the wiring board, an insulating, second layer disposed between the semiconductor chip and the first layer, a conductive member for connecting a surface electrode on the semiconductor chip with a corresponding connecting terminal on the wiring board, a sealing portion formed by sealing the semiconductor chip and the conductive member with resin, and a plurality of external terminals provided on the side opposite to a chip supporting surface of the wiring board, the first layer having an elastic modulus smaller than that of the second layer.

In a still further aspect of the present invention there is provided a semiconductor device comprising a wiring board, a semiconductor chip disposed on the wiring board, an insulating, first layer disposed between the semiconductor chip and the wiring board, an insulating, second layer disposed between the semiconductor chip and the first layer, a conductive member for connecting a surface electrode on the semiconductor chip with a corresponding connecting terminal on the wiring board, a sealing portion formed by sealing the semiconductor chip and the conductive member with resin, and a plurality of external terminals disposed on the side opposite to a chip supporting surface of the wiring board, the first layer having a density lower than that of the second layer.

In a still further aspect of the present invention there is provided a semiconductor device comprising a wiring board, a semiconductor chip disposed on the wiring board, an insulating, first layer disposed between the semiconductor chip and the wiring board, an insulating, second layer disposed between the semiconductor chip and the wiring board and formed harder than the first layer, an air vent portion for sending out air generated within the semiconductor device to the exterior, a conductive member for connecting a surface electrode on the semiconductor chip with a corresponding connecting terminal on the wiring board, a sealing portion formed by sealing the semiconductor chip and the conductive member with resin, and a plurality of external terminals disposed on the side opposite to a chip supporting surface of the wiring board.

In a still further aspect of the present invention there is provided a method of manufacturing a semiconductor device comprising a wiring board, a semiconductor chip disposed on the wiring board, an insulating, first layer disposed between the wiring board and the semiconductor chip, and an insulating, second layer disposed between the semiconductor chip and the insulating, first layer, the method comprising the steps of providing the wiring board, bonding the wiring board and the semiconductor chip to each other while interposing the first and second layers therebetween, the second layer being formed harder than the first layer, connecting a surface electrode on the semiconductor chip with a corresponding connecting terminal on the wiring board through a conductive member, and sealing the semiconductor chip and the conductive member with a molding resin to form a sealing portion.

In a still further aspect of the present invention there is provided a method of manufacturing a semiconductor device comprising a wiring board, a semiconductor chip disposed on the wiring board, an insulating, first layer disposed between the wiring board and the semiconductor chip, and an insulating, second layer disposed between the semiconductor chip and the insulating, first layer, the method comprising the steps of providing a semiconductor wafer with a plurality of semiconductor chip areas formed thereon, bonding the semiconductor wafer and a dicing tape to each other while interposing the second layer between the side opposite to a main surface of the semiconductor wafer and the dicing tape, the second layer being formed harder than the first layer, dicing the semiconductor wafer into individual pieces as semiconductor chips, separating each of the individual semiconductor chips and the dicing tape from each other while allowing the second layer to remain on the side opposite to a main surface of the semiconductor chip, bonding the wiring board and the semiconductor chip to each other while interposing the first and second layers between the wiring board and the semiconductor chip, connecting a surface electrode on the semiconductor chip with a corresponding connecting terminal on the wiring board through a conductive member, and sealing the semiconductor chip and the conductive member with a molding resin to form a sealing portion.

In a still further aspect of the present invention there is provided a method of manufacturing a semiconductor device comprising a wiring board, a semiconductor chip disposed on the wiring board, an insulating, first layer disposed between the wiring board and the semiconductor chip, and an insulating, second layer disposed between he semiconductor chip and the insulating, first layer, the method comprising the steps of providing a semiconductor wafer with a plurality of semiconductor chip areas formed thereon, bonding the semiconductor wafer and a dicing tape to each other while interposing an insulating sheet member as the second layer between the side opposite to a main surface of the semiconductor wafer and the dicing tape, the second layer being formed harder than an insulating paste layer as the first layer, dicing the semiconductor wafer into individual pieces as semiconductor chips, separating each of the individual semiconductor chips and the dicing tape from each other while allowing the insulating sheet member to remain on the side opposite to a main surface of the individual semiconductor chip, disposing the insulating paste layer on a first surface of the wiring board, disposing the insulating sheet member on the insulating paste layer, bonding the wiring board and the semiconductor chip to each other while interposing the insulating paste layer and the insulating sheet member between the wiring board and the semiconductor chip, connecting a surface electrode on the semiconductor chip with a corresponding connecting terminal on the wiring board through a conductive member, and sealing the semiconductor chip and the conductive member with a molding resin to form a sealing portion.

In a still further aspect of the present invention there is provided a method of manufacturing a semiconductor device comprising a wiring board, a semiconductor chip disposed on the wiring board, an insulating, first layer disposed between the wiring board and the semiconductor chip, and an insulating, second layer disposed between the semiconductor chip and the insulating, first layer, the method comprising the steps of providing a semiconductor wafer with a plurality of semiconductor chip areas formed thereon, bonding the side opposite to a main surface of the semiconductor wafer and a dicing tape to each other, the dicing tape having the second layer formed harder than an insulating paste layer as the first layer, dicing the semiconductor wafer into individual pieces as semiconductor chips, separating each of the individual semiconductor chips and the dicing tape from each other while allowing the second layer to remain on the side opposite to a main surface of the semiconductor chip, disposing the insulating paste layer on a first surface of the wiring board, disposing the second layer on the insulating paste layer, and thereby interposing the insulating paste layer and the second layer between the wiring board and the semiconductor chip, heating the insulating paste layer and the second layer to bond the wiring board and the semiconductor chip to each other, connecting a surface electrode on the semiconductor chip with a corresponding connecting terminal on the wiring board through a conductive member, and sealing the semiconductor chip and the conductive member with a molding resin to form a sealing portion.

In a still further aspect of the present invention there is provided a method of manufacturing a semiconductor device, comprising the steps of providing a semiconductor chip with an insulating sheet member affixed to a back side thereof, disposing the semiconductor chip on a wiring board through an insulating paste layer and the insulating sheet member, performing a heat treatment to harden the insulating paste layer and make it porous, and sealing upper and side portions of the semiconductor chip with resin.

BRIEF DESCRIPTION OF THE DRAWINGS

FIG. 11 is a process flow diagram showing a detailed procedure from sheet affixing to die bonding according to a sheet affixing method in the assembling procedures shown in FIGS. 9 and 10 for the BGA of the embodiment;

FIGS. 17(a) and 17(b) are enlarged partial sectional views showing a state of breakage of a bump electrode bonded portion caused by the deterioration of the temperature cyclicity shown in FIG. 16, of which FIG. 17(a) shows a state before breakage of the bump electrode bonded portion and FIG. 17(b) shows a state after the breakage;

DETAILED DESCRIPTION OF PREFERRED EMBODIMENTS

Figure 1A:
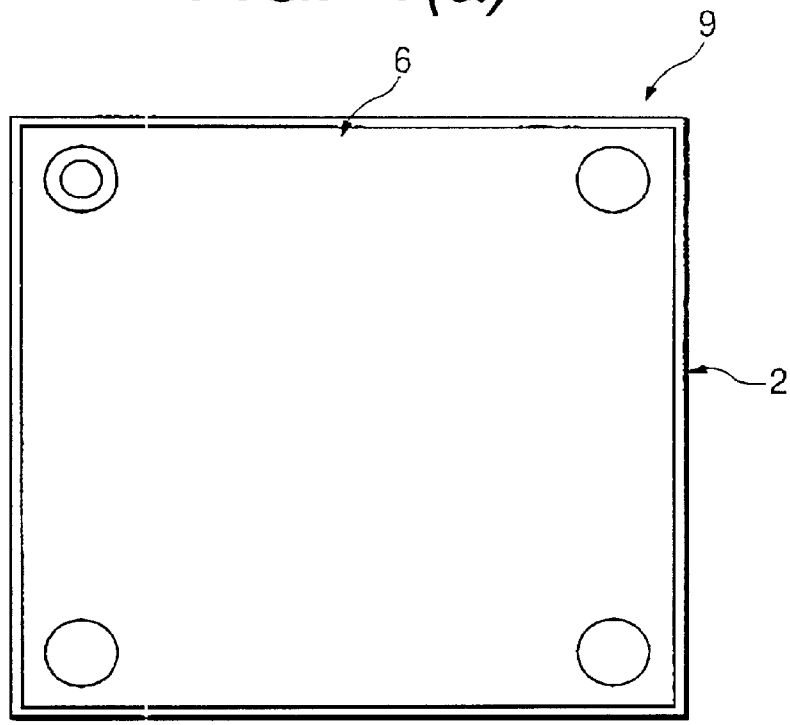
FIGS. 1(a) and 1(b) are appearance diagrams showing an example of a structure of a semiconductor device (BGA) according to an embodiment of the present invention.

The present invention will be described in detail hereunder by way of embodiments thereof illustrated in the drawings. In all of the drawings for illustration of the drawings, components having the same functions are identified by the same reference numerals and repeated explanations thereof will be omitted.

Figure 1B:
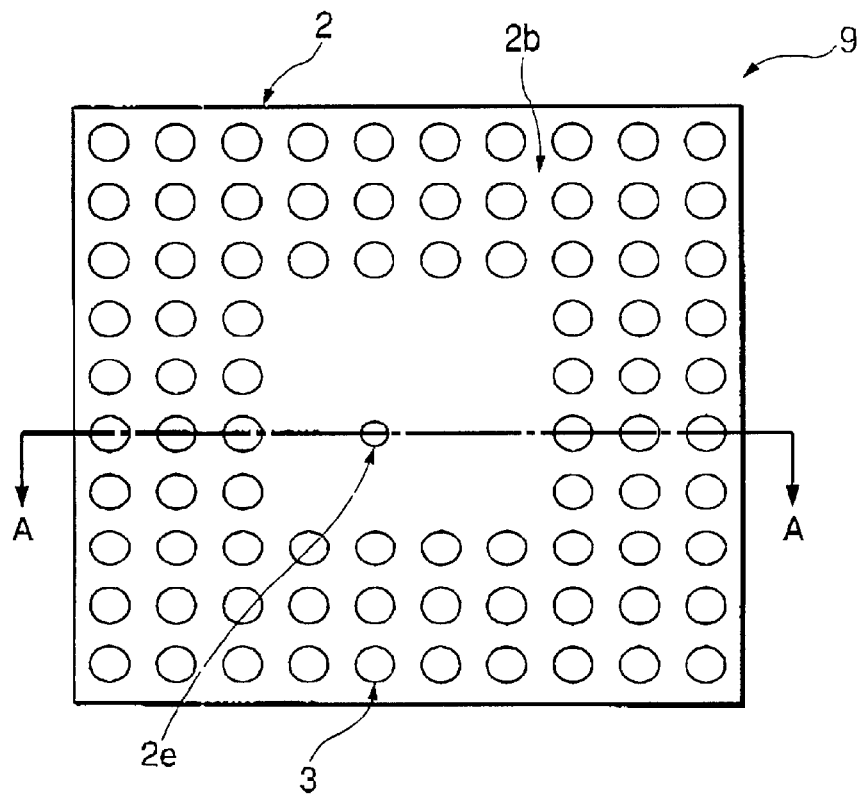
Figure 2:
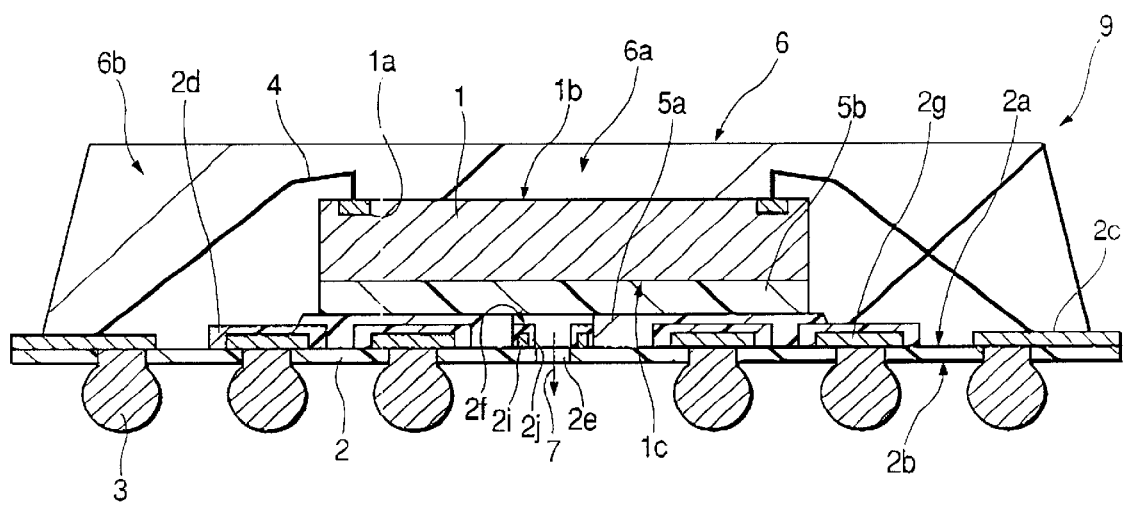
FIG. 2 is a sectional view showing a sectional structure of the BGA taken along line A—A in FIG. 1(b)
Figure 3A:
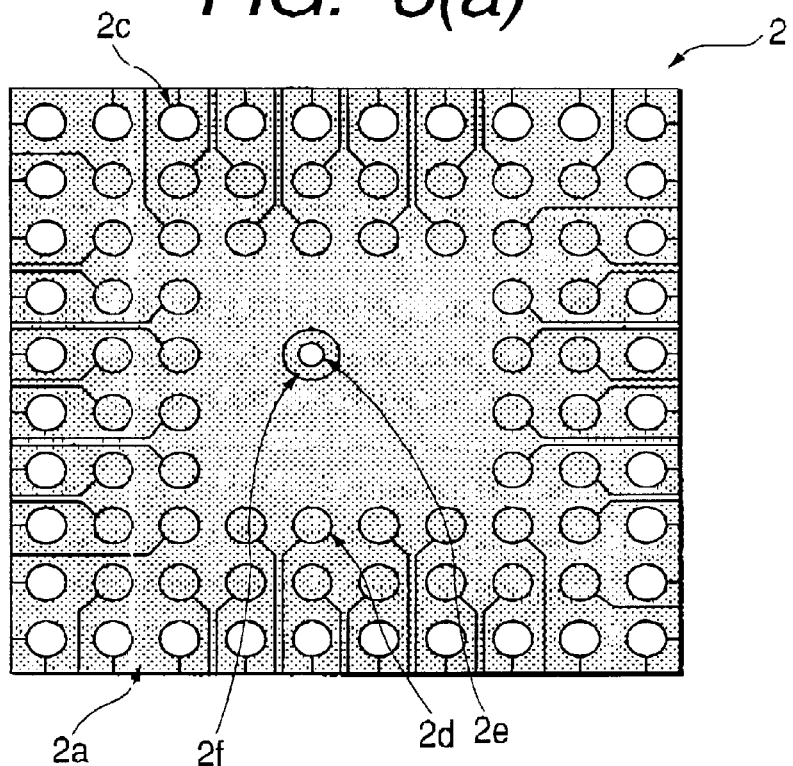
FIG. 3(a) is a plan view showing an example of a structure of a wiring board (tape substrate) used in assembling the BGA shown in FIG. 1
Figure 3B:
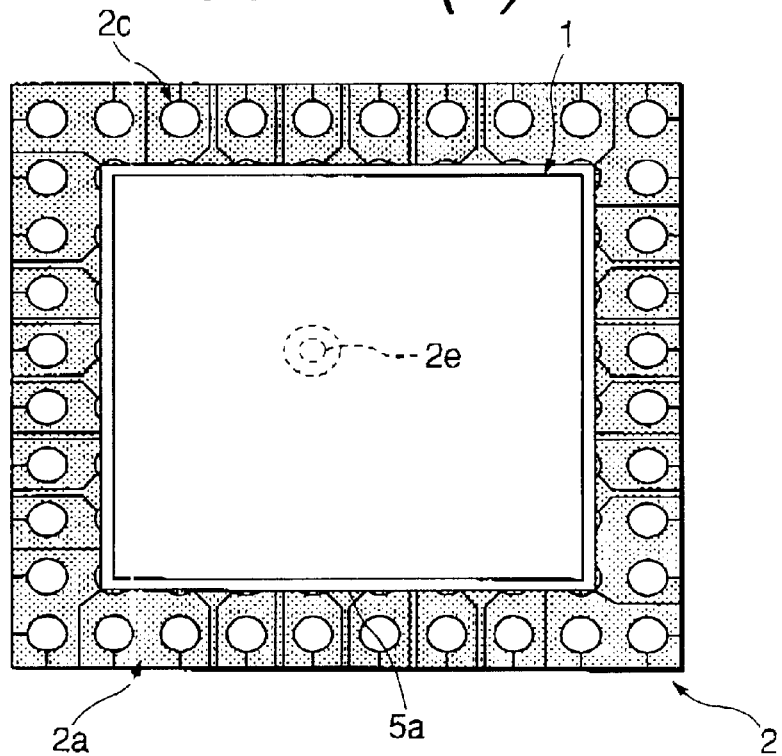
FIG. 3(b) is a plan view showing an example of a structure after die bonding in an assembling work using the wiring board shown in FIG. 3(a)
Figure 4:
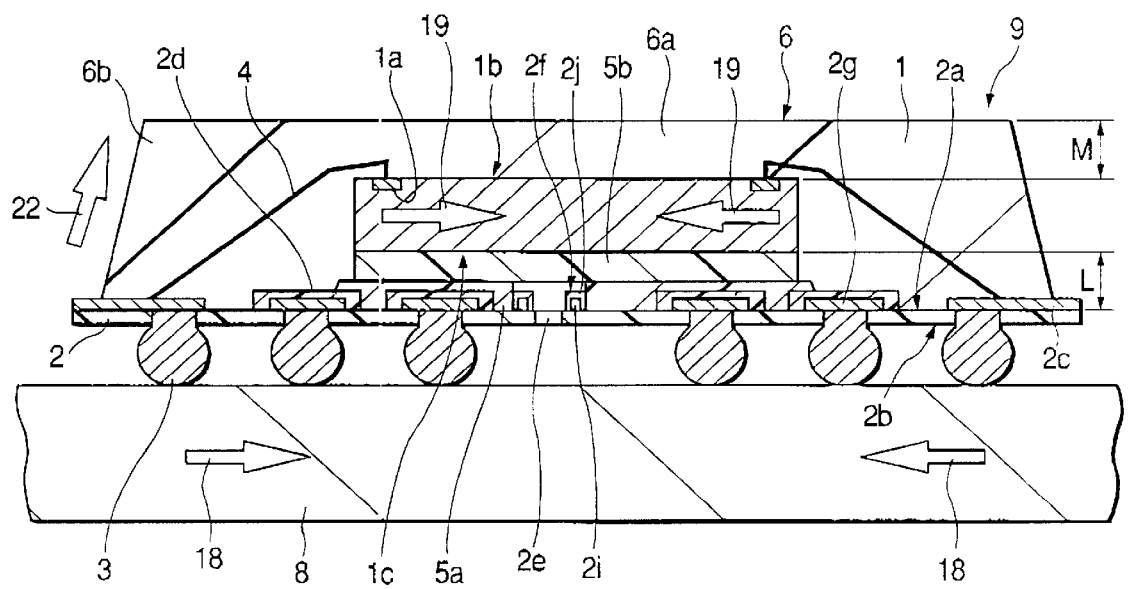
FIG. 4 is a sectional view showing a package warp remedied state in the BGA of the embodiment shown in FIG. 1
Figure 5:
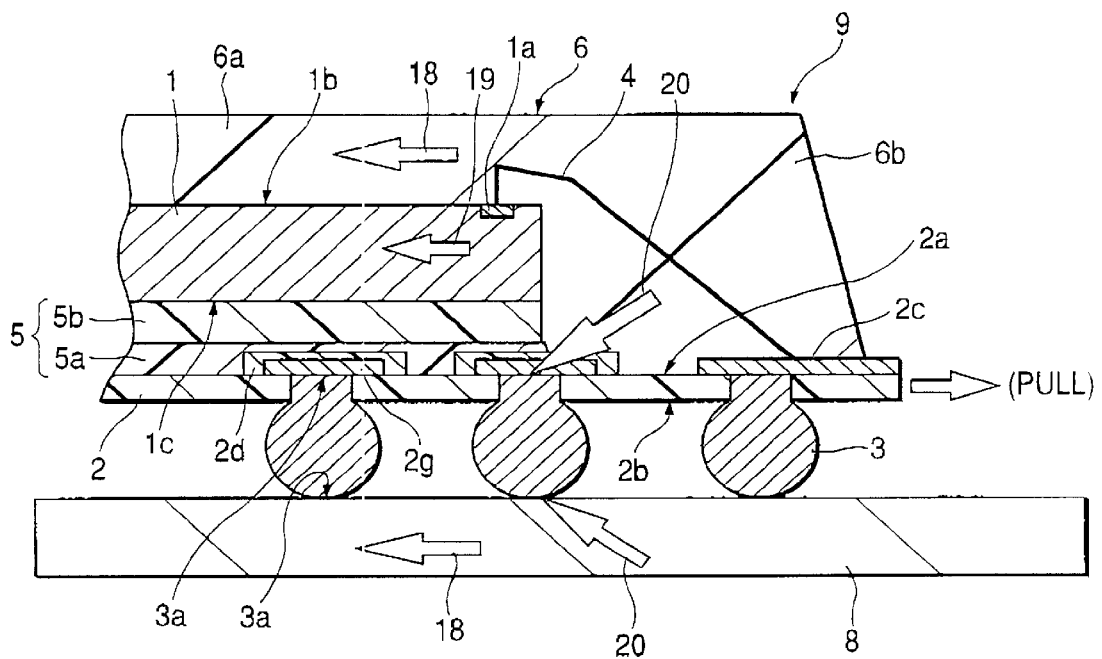
FIG. 5 is an enlarged partial sectional view showing a temperature cyclicity improved state in mounting the BGA of the embodiment shown in FIG. 1 onto a mounting substrate.
Figure 6:
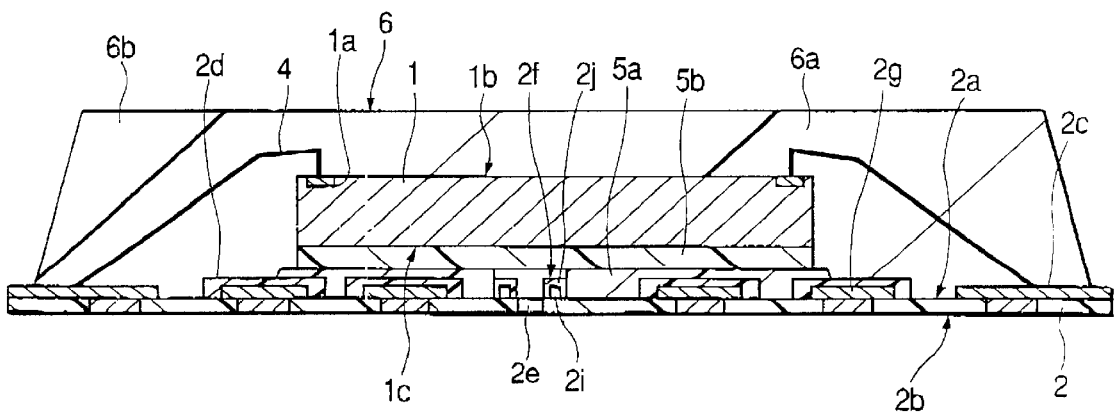
FIG. 6 is a sectional view showing an adhesion improved state of a die bonding layer in the BGA of the embodiment shown in FIG. 1.
Figure 7:
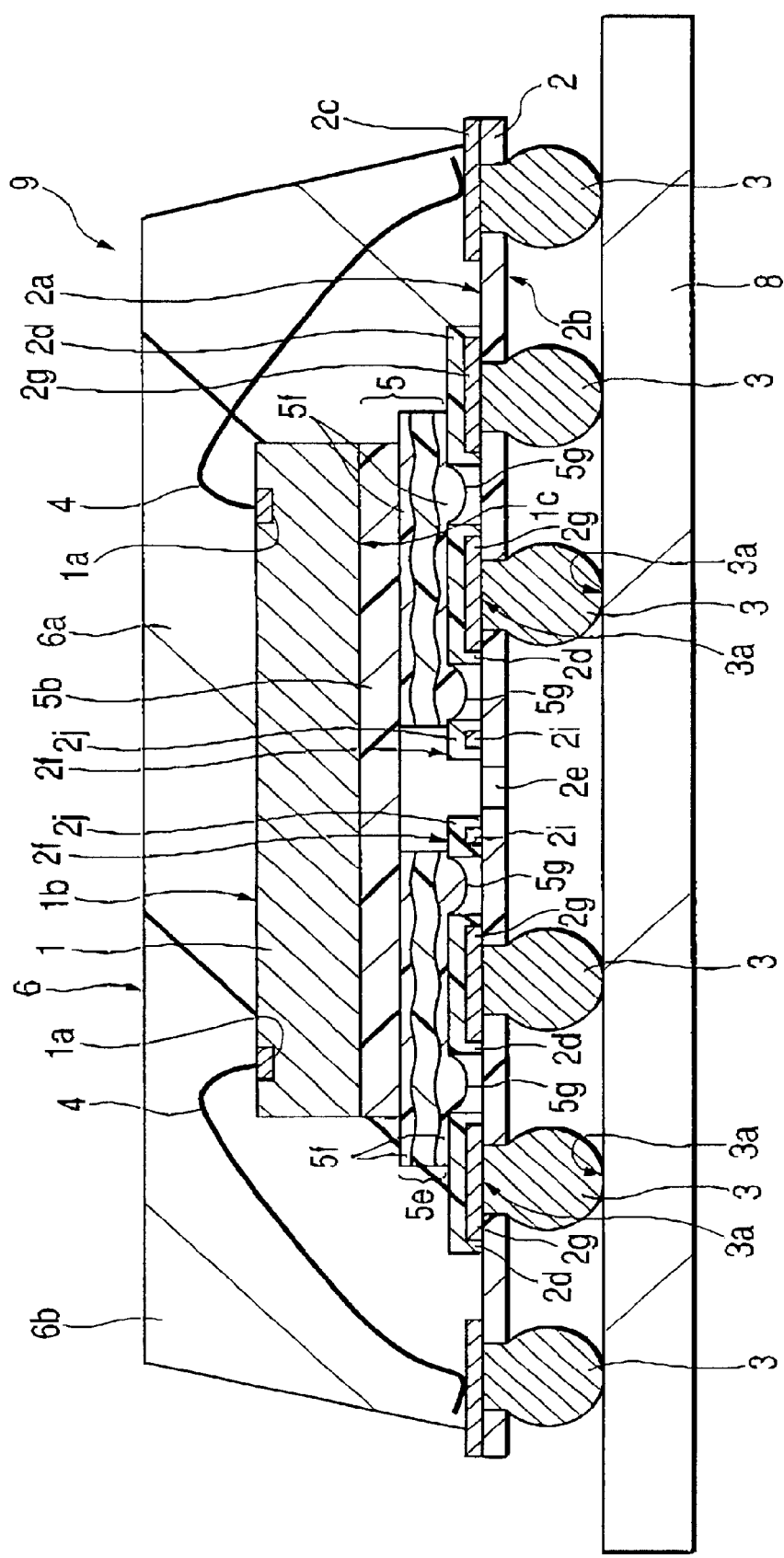
FIG. 7 is an enlarged sectional view showing a structure of a BGA as a modification of the BGA shown in FIG. 1.
Figure 8:
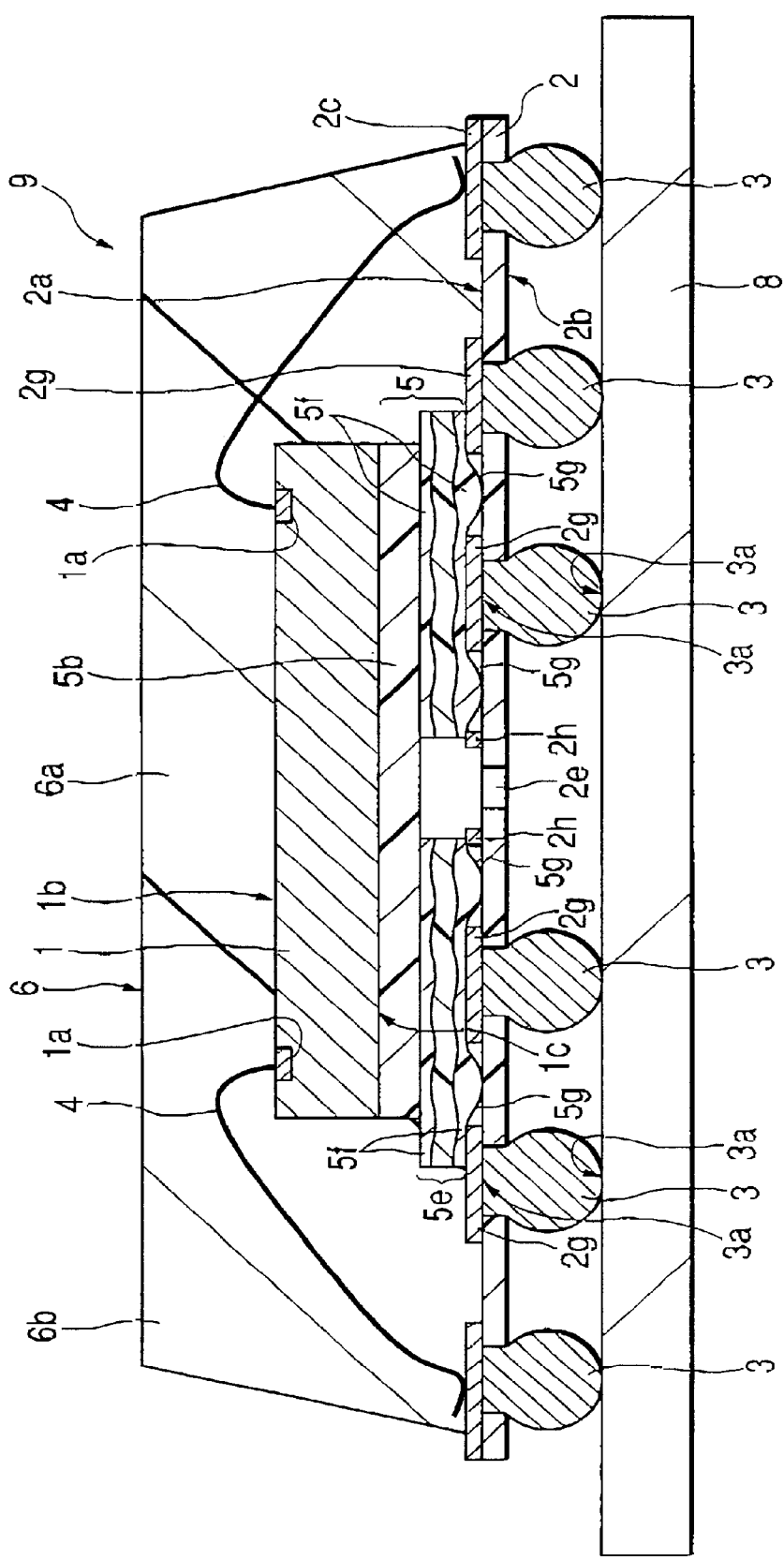
FIG. 8 is an enlarged sectional view showing a structure of a BGA as a modification of the BGA shown in FIG. 1.
Figure 9:
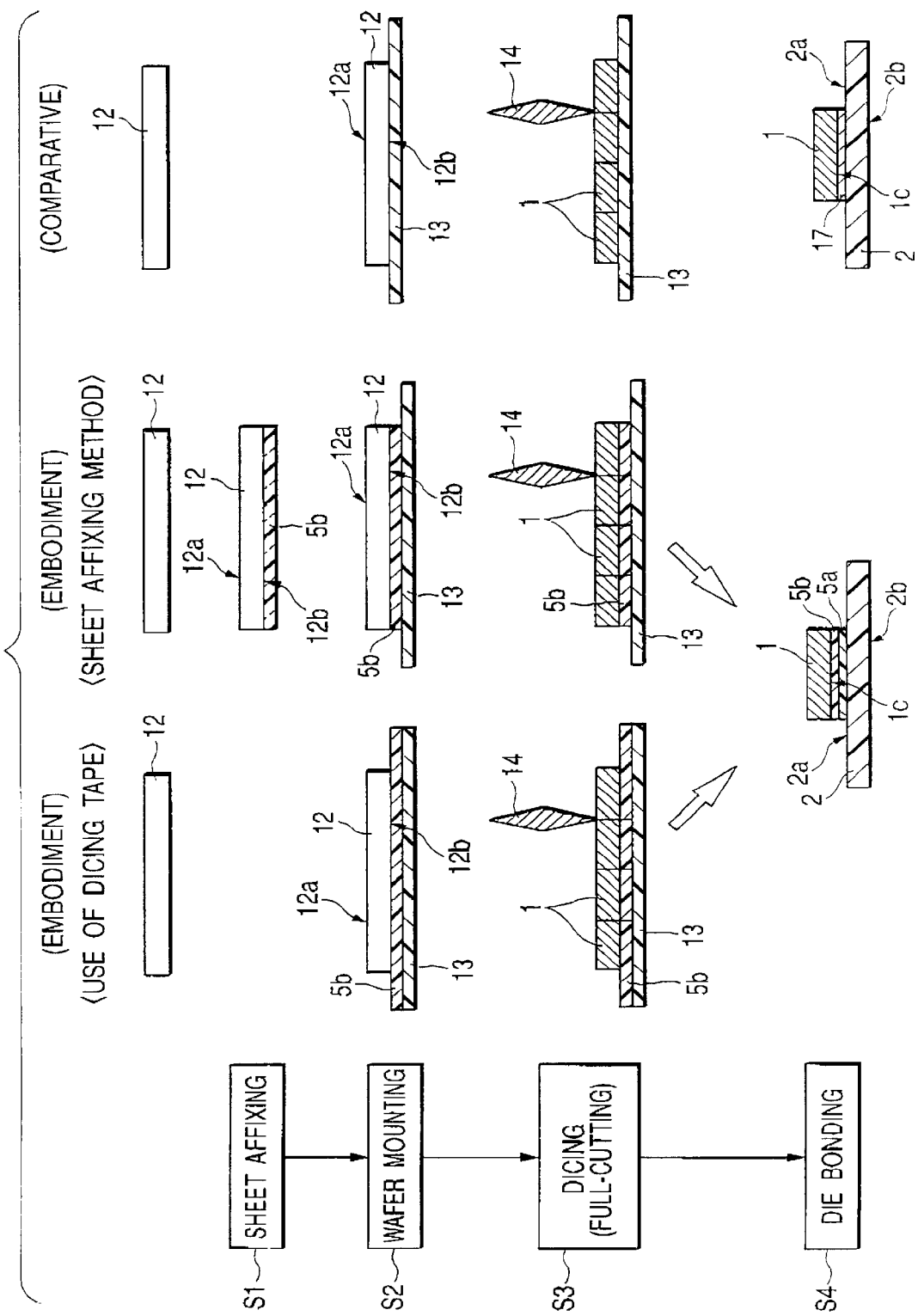
FIG. 9 is a process flow diagram showing an example of an assembling procedure up to a die bonding step with respect to each of the BGA of the embodiment shown in FIG. 1 and a comparative BGA shown in FIG. 13.
Figure 10:
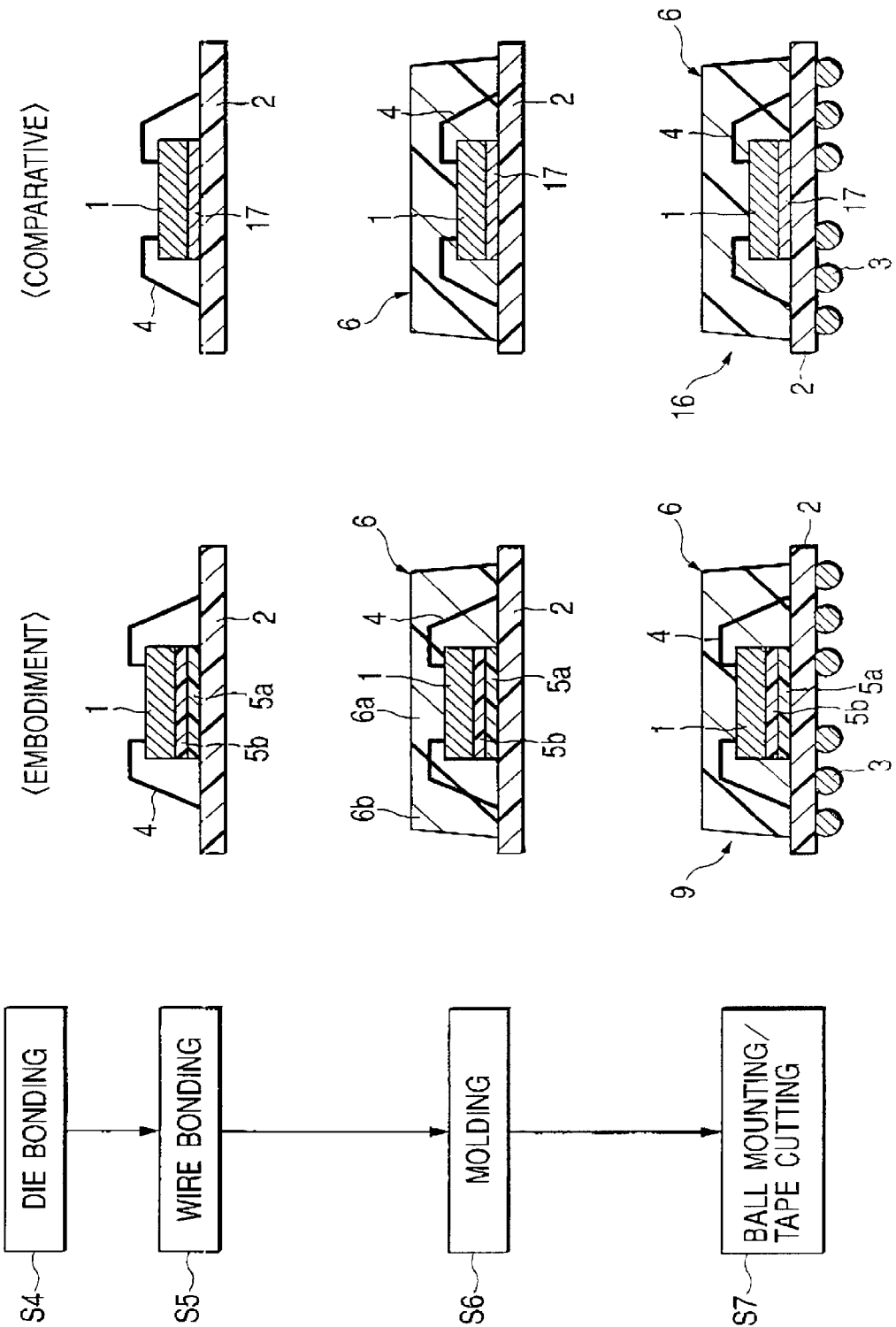
FIG. 10 is a process flow diagram showing an example of an assembling procedure after the die bonding step with respect to each of the BGA of the embodiment shown in FIG. 1 and the comparative BGA shown in FIG. 13.
Figure 12:
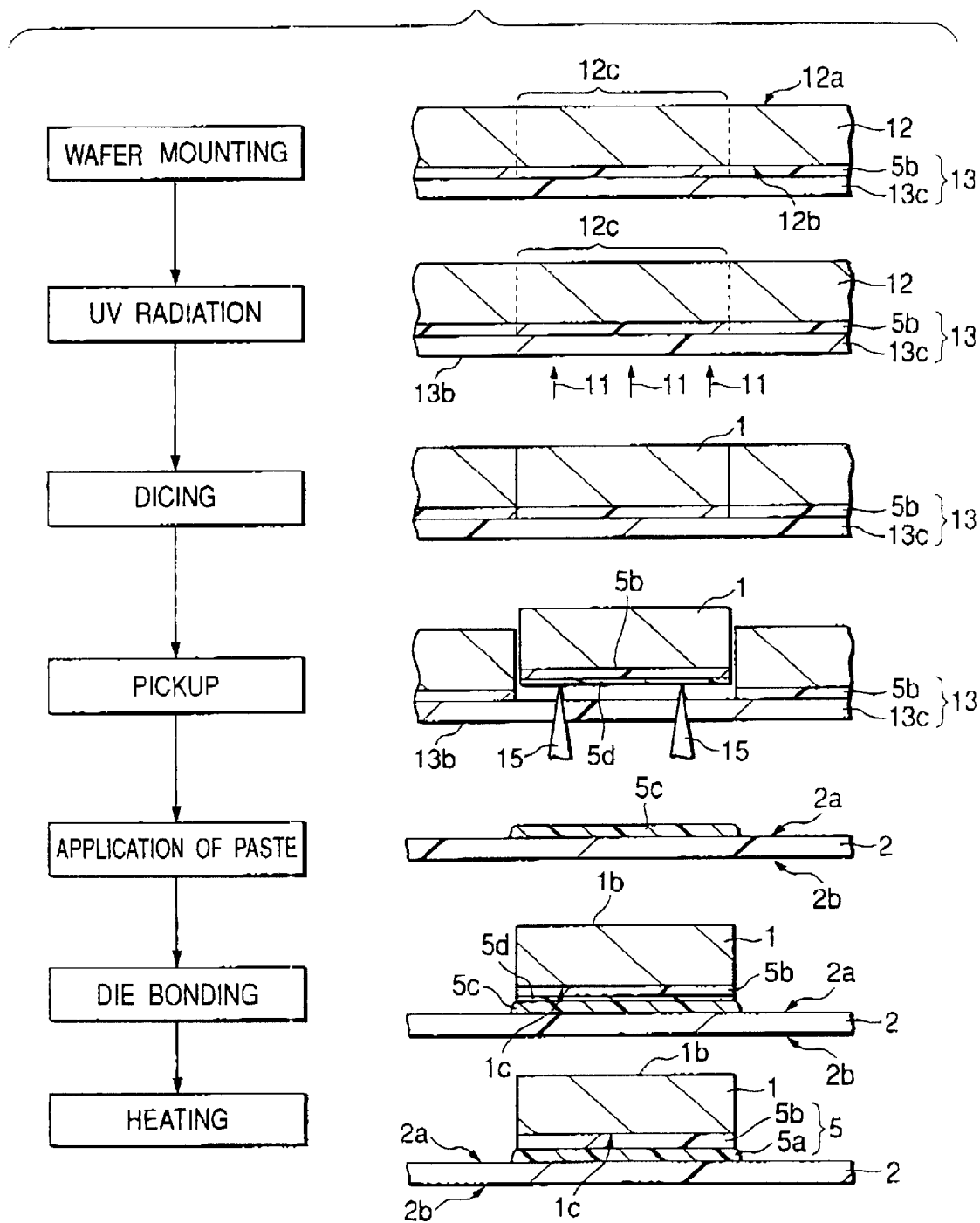
FIG. 12 is a process flow diagram showing a detailed procedure from wafer mounting to die bonding according to a method using a dicing tape in the assembling procedures shown in FIGS. 9 and 10 for the BGA of the embodiment.
Figure 13:
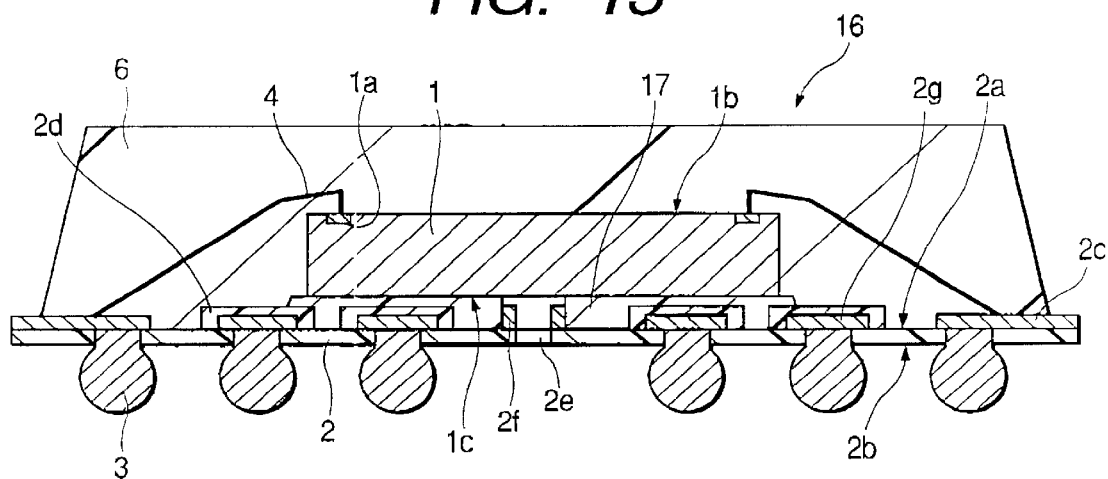
FIG. 13 is a sectional view showing a structure of a comparative BGA in comparison the BGA shown in FIG. 1.
Figure 14:
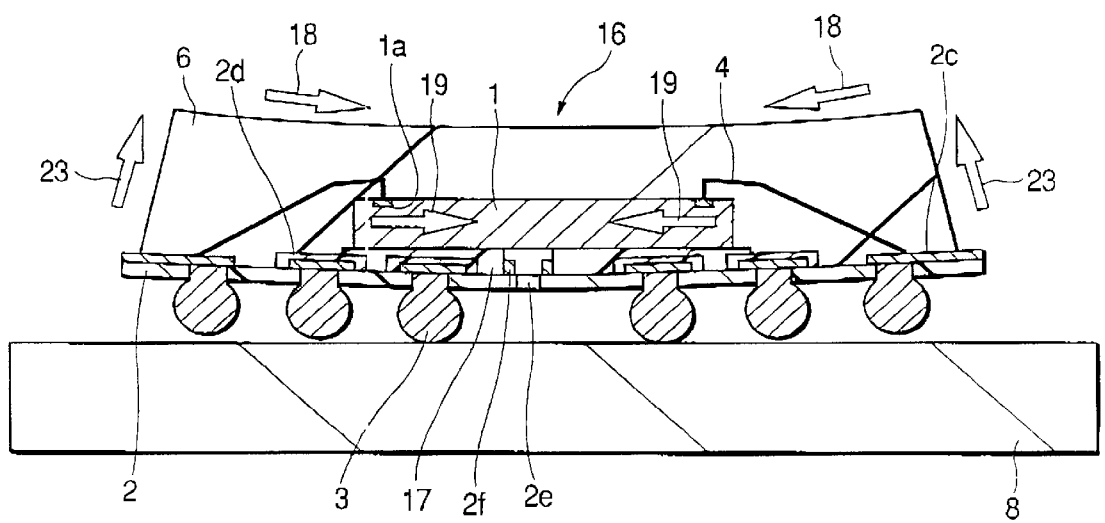
FIG. 14 is a sectional view showing a package warped state in the comparative BGA shown in FIG. 13.
Figure 15:
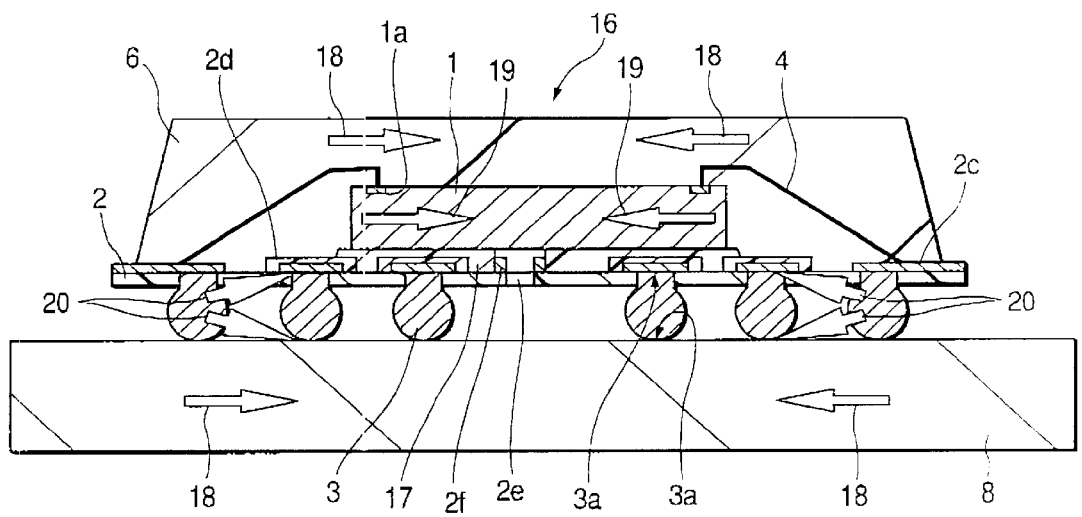
FIG. 15 is a sectional view showing a mechanism of deterioration of the temperature cyclicity in mounting the comparative BGA shown in FIG. 13 onto a mounting substrate.
Figure 16:
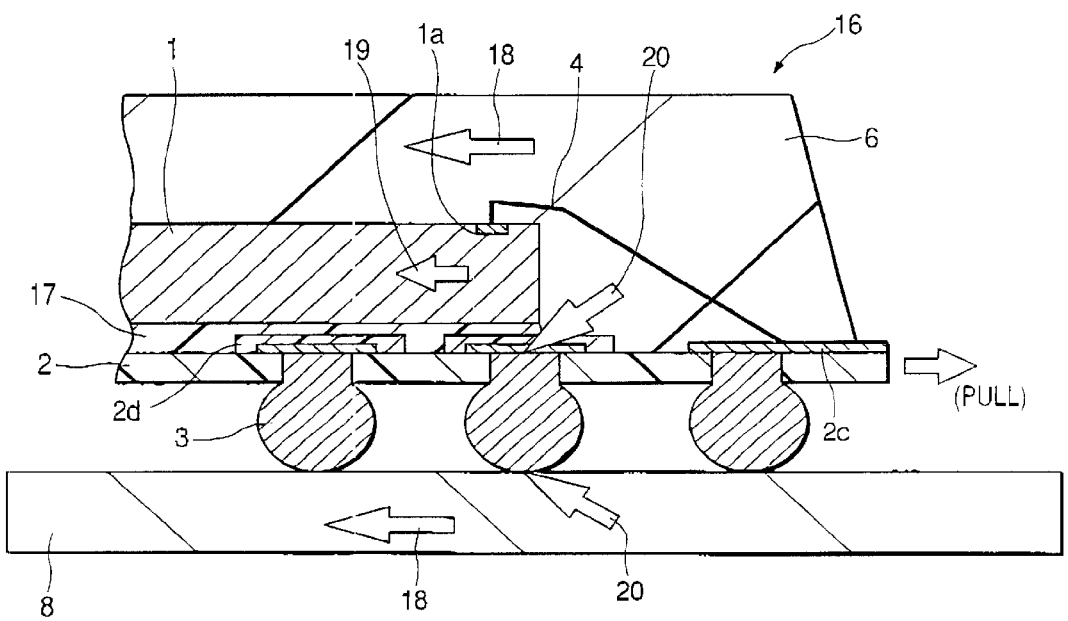
FIG. 16 is an enlarged partial sectional view showing on a larger scale the mechanism of deterioration of the temperature cyclicity shown in FIG. 15.
Figure 18:
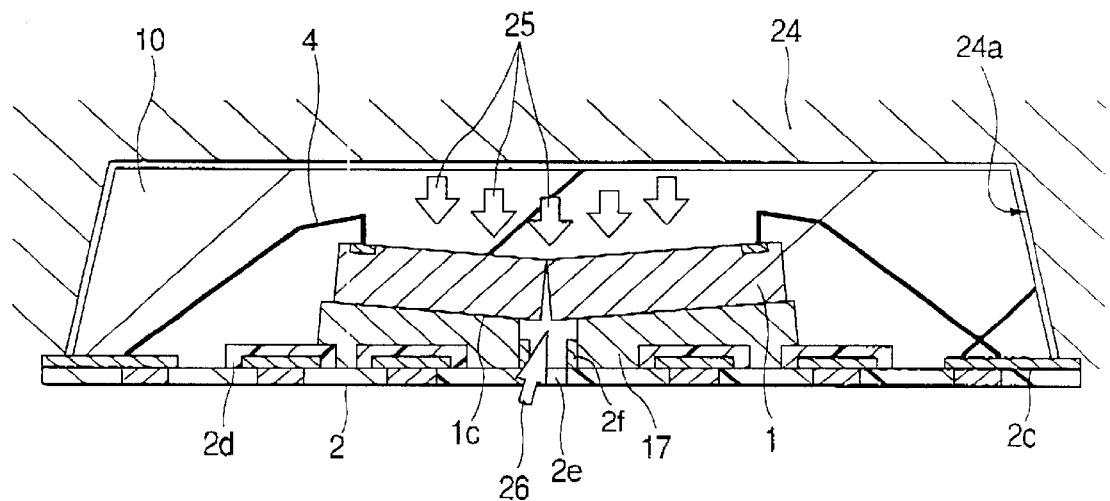
FIG. 18 is a partial sectional view showing a cracked state of a chip in the comparative BGA shown in FIG. 13.
Figure 19:
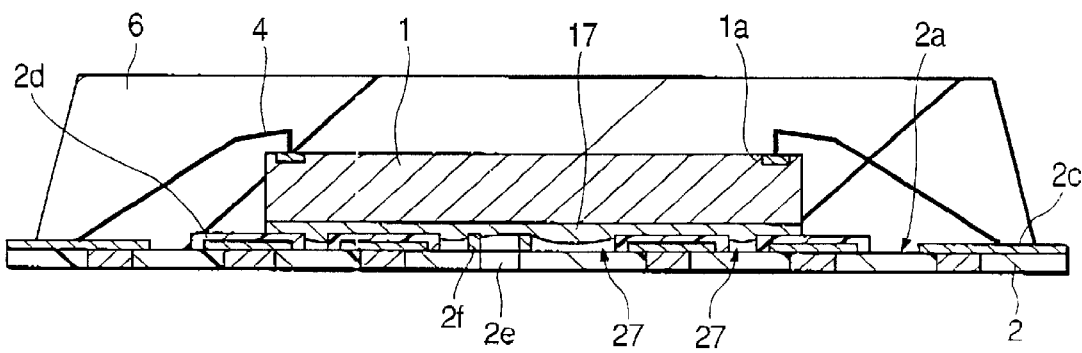
FIG. 19 is a sectional view showing a non-bonded state of a die bonding material in the comparative BGA shown in FIG. 13.

FIG. 1 is an appearance diagram showing an example of a structure of a semiconductor device (BGA) according to an embodiment of the present invention, in which (a) is a plan view and (b) is a bottom view, FIG. 2 is a sectional view showing a sectional structure of the BGA taken along line A—A in FIG. 1(b), FIG. 3(a) is a plan view showing an example of a structure of a wiring board (tape substrate) used in assembling the BGA shown in FIG. 1 and FIG. 3(b) is a plan view showing an example of a structure after die bonding in an assembling work using the wiring board shown in FIG. 3(a), FIG. 4 is a sectional view showing a package warp remedied state in the BGA of the embodiment shown in FIG. 1, FIG. 5 is an enlarged partial sectional view showing a temperature cyclicity improved state in mounting the BGA of the embodiment shown in FIG. 1 onto a mounting substrate, FIG. 6 is a sectional view showing an adhesion improved state of a die bonding layer in the BGA of the embodiment shown in FIG. 1, FIG. 7 is an enlarged sectional view showing a structure of a BGA as a modification of the BGA shown in FIG. 1, FIG. 8 is an enlarged sectional view showing a structure of a BGA as a modification of the BGA shown in FIG. 1, FIG. 9 is a process flow diagram showing an example of an assembling procedure up to a die bonding step with respect to each of the BGA of the embodiment shown in FIG. 1 and a comparative BGA shown in FIG. 13, FIG. 10 is a process flow diagram showing an example of an assembling procedure after the die bonding step with respect to each of the BGA of the embodiment shown in FIG. 1 and the comparative BGA shown in FIG. 13, FIG. 11 is a process flow diagram showing a detailed procedure from sheet affixing to die bonding according to a sheet affixing method in the assembling procedure shown in FIGS. 9 and 10 for the BGA of the embodiment, FIG. 12 is a process flow diagram showing a detailed procedure from wafer mounting to die bonding according to a method using a dicing tape in the assembling procedures shown in FIGS. 9 and 10 for the BGA of the embodiment, FIG. 13 is a sectional view showing a comparative BGA in comparison with the BGA shown in FIG. 1, FIG. 14 is a sectional view showing a warped state of a package in the comparative BGA shown in FIG. 13, FIG. 15 is a sectional view showing a mechanism of deterioration of the temperature cyclicity in mounting the comparative BGA shown in FIG. 13 onto a mounting substrate, FIG. 16 is an enlarged partial sectional view showing on a larger scale the mechanism of deterioration of the temperature cyclicity shown in FIG. 15, FIG. 17 is an enlarged partial sectional view showing a state of breakage of a bump electrode bonded portion caused by the deterioration of the temperature cyclicity shown in FIG. 16, in which FIG. 17(a) shows a state before breakage of the bump electrode bonded portion and FIG. 17(b) shows a state after the breakage, FIG. 18 is a partial sectional view showing a cracked state of a chip in the comparative BGA shown in FIG. 13, and FIG. 19 is a sectional view showing a non-bonded state of a die bonding material in the comparative BGA shown in FIG. 13.

In the semiconductor device of this embodiment shown in FIGS. 1 and 2, a chip supporting substrate which supports a semiconductor chip 1 is a tape substrate (wiring board) 2 formed by a thin film, and on a chip supporting surface 2a side of the tape substrate 2 the semiconductor chip 1 is sealed with resin by molding to afford a semiconductor package.

On the side (hereinafter referred to as the "back 2b") opposite to the chip supporting surface 2a of the tape substrate 2, as shown in FIG. 1(b), plural solder balls (bump electrodes) 3 as external terminals are arranged in a matrix form except a central portion. The semiconductor device of such a structure is called a semiconductor device of an area array type. The semiconductor device of this embodiment is a Fan-In/Fan-Out type BGA 9 wherein plural solder balls 3 are arranged in areas corresponding to inside and outside of the semiconductor chip 1.

Now, with reference to FIGS. 1 to 3, the following description is provided about the structure of the BGA 9. The BGA 9 comprises the tape substrate 2 which supports the semiconductor chip 1, an insulating adhesive layer 5a as an insulating, first layer disposed in a bonded state to the tape substrate 2 between the semiconductor chip 1 and the tape substrate 2, an insulating sheet member 5b as an insulating, second layer 5b disposed in a laminated state to the insulating adhesive layer 5a and a bonded state to the semiconductor chip 1 between the semiconductor chip and the tape substrate 2, the insulating sheet member 5b being formed harder than the insulating adhesive layer 5a, bonding wires 4 such as gold wires as conductive members for connecting pads (surface electrodes) 1a on the semiconductor chip with corresponding connecting terminals 2c on the tape substrate 2, a sealing portion 6 formed by sealing the semiconductor chip 1 and the wires 4 with resin, and plural solder balls as external terminals formed on the back 2b of the tape substrate 2. The insulating adhesive layer 5a has a water permeability higher than that of the insulating sheet member 5b.

In the BGA 9, a die bonding layer 5 shown in FIG. 5, with the semiconductor chip 1 fixed thereto, is made up of the insulating adhesive layer 5a as the first layer disposed on a lower side (tape substrate side) and the insulating sheet member 5b as the second layer laminated onto the insulating adhesive layer 5a and formed harder than the insulating adhesive layer. Thus, by using a multi-layer (two layers in this embodiment) structure, the die bonding layer 5 is made thick, whereby it is intended to improve the balance, so-called resin balance, between insulating members disposed respectively on the surface and the back of the semiconductor chip 1, thereby prevent warping of the package, and it is also intended to improve the mounting temperature cyclicity, reflow characteristic and mounting performance.

The insulating adhesive layer 5a as a constituent of the die bonding layer 5 is formed of a material containing an epoxy resin as a principal component which is obtained by applying a pasty adhesive (an insulating paste layer 5c as a first layer shown in FIG. 11) containing a prepolymer and heat-curing the adhesive.

The epoxy resin undergoes a crosslinking reaction upon curing into a porous structure, thereby affording a very high permeability to water and gas and a stress absorbability based on a low elastic modulus. A porous body as referred to herein indicates an open cell structure having a large number of fine pores in the interior thereof or a three-dimensional network structure. The epoxy resin is very suitable for its application to a semiconductor device because it has a fine structure and high heat and chemicals resistance.

In this connection, since the insulating sheet member 5b is of a harder structure than the insulating adhesive layer 5a, it is possible to prevent buckling of the semiconductor chip 1 caused by a resin injection pressure and an internal stress induced upon curing and shrinkage of resin, which is illustrated in FIG. 18. The hard structure or layer as referred to herein indicates, for example, one having a high modulus of elasticity, a high elastic limit, or a high yield point, generally one which undergoes little deformation against stress and which has a high ability to prevent buckling of the semiconductor chip 1.

A vent hole (air vent portion) 2e for sending out air 7 generated within the BGA 9 to the exterior is formed as a through hole in a chip mounting area of the tape substrate 2 of the BGA 9.

A single vent hole 2e is formed in the substrate 2 of the BGA 1 at a position somewhat deviated from the center of the tape substrate, as shown in FIGS. 1(b) and 3(a).

This deviation of the vent hole 2e from the center is intended for the vent hole to serve also as an index of the tape substrate 2.

However, the number of the vent hole 2e is not limited to one, but may be plural, and also as to the position thereof, it may be formed centrally of the tape substrate 2.

In the BGA 9, as shown in FIGS. 2 and 3(a), a cylindrical insulating dam 2f is formed around the vent hole 2e formed in the tape substrate 2.

This is for preventing a pasty adhesive (the insulating paste layer 5c shown in FIG. 11) from flowing (leaking) out of the vent hole 2e when applied to the chip supporting surface 2a of the tape substrate 2. For example, the insulating dam 2f is composed of a cylindrical conductor film 2i formed by the same layer as the wiring layer on the tape substrate 2 and an insulating film 2j formed by the same layer as solder resist 2d formed on the cylindrical conductor film 2i. By utilizing such a laminate structure of the conductor film 2i and the insulator film 2j, the insulating dam 2f can be formed so as to have a sufficient height and it is possible to increase the thickness of the applicable adhesive layer on condition that there is no outflow from the vent hole 2e.

The insulating dam 2f is not always needed, and also as to its shape and height, various changes may be made.

On the tape substrate 2, bump lands 2g as external terminal mounting electrodes disposed on the chip supporting surface 2a, as well as connecting terminals 2c, are plated with gold. Of the bump lands 2g, those disposed in the chip mounting area and portions thereof exposed to the chip supporting surface 2a side are covered with the solder resist 2d which is an insulating thin film and are thereby insulated from one another, as shown in FIGS. 2 and 3(a).

However, as shown in FIG. 3(b), the connecting terminals 2c arranged on an outer periphery of the semiconductor chip 1 are not covered with the solder resist 2d but are exposed for connection with the wires 4.

In the BGA 9, as shown in FIG. 4, the die bonding layer 5 (see FIG. 5) as a combination of the insulating adhesive layer 5a as the first layer and the insulating sheet member 5b as the second layer, and a chip sealing portion 6a which covers a main surface 1b of the semiconductor chip 1, are formed so that the thickness (L) of the die bonding layer 5 and the thickness (M) of the chip sealing portion 6a are almost equal to each other.

More particularly, by using the insulating sheet member 5b it is possible to easily thicken the die bonding layer 5, that is, the thickness of the die bonding layer 5 can be adjusted.

Therefore, it is possible to improve the balance, or so-called resin balance, between the insulating members disposed on the surface and the back respectively of the semiconductor chip 1.

The thickness (L) of the die bonding layer 5 comprising the insulating adhesive layer 5a and the insulating sheet member 5b differs depending on the height (thickness) of the BGA 9. For example, $(L) \approx (M) \geq 50$ $\mu$m, preferably 50 $\mu$m $\leq (L) \approx (M) \leq 100$ $\mu$m, taking into account the thickness (for example, 280 $\mu$m) of the semiconductor chip 1, thickness (for example, 80 $\mu$m) of the tape substrate 2, and loop height of each wire 4.

Therefore, in the case where the thickness of the tape substrate 2 is about 80 $\mu$m, the thickness (L) of the die bonding layer 5 composed of the insulating adhesive layer 5a and the insulating sheet member 5b may be set almost equal to the thickness of the tape substrate 2.

The insulating adhesive layer 5a as the first layer in the die bonding layer 5 is a porous layer low in resin density formed by heat-curing, for example, a pasty epoxy adhesive (the insulating paste layer 5c shown in FIG. 11). The thickness thereof is, for example, 20 to 30 $\mu$m.

The insulating sheet member 5b as the second layer which overlies the insulating adhesive layer 5a in the die bonding layer 5, is for example, an adhesive layer obtained by pressing together an insulating epoxy resin thinly into a sheet with use of a roller or the like, or a single sheet-like insulating layer formed of a polyimide resin.

Thus, the insulating sheet member 5b is formed as a layer harder than the insulating adhesive layer 5a as the first layer. However, such a hard layer is generally high in density and low in water and gas permeability. Therefore, if such a hard layer is formed very thick just under the semiconductor chip 1, the gas permeability between the chip 1—sheet member 5b interface and the exterior and also between the chip 1—sealing portion 6 interface will be impaired. In this case, even if the porous, insulating adhesive layer 5a underlies the insulating sheet member 5b, it will be impossible to prevent peeling from a peripheral interface portion of the chip low in bonding force or the occurrence of a popcorn phenomenon.

For this reason it is preferable that the insulating sheet member 5b be formed as thin as possible, for example 20 to 30 $\mu$m, in a range which permits preventing the buckling of the chip.

As the insulating sheet member 5b as the second layer there may be used not only one containing an ultraviolet curing agent which cures and becomes less sticky upon being irradiated with ultraviolet ray 11 shown in FIG. 11, but also one which does not contain such an ultraviolet curing agent.

The tape substrate 2 as a chip supporting substrate capable of mounting the semiconductor chip 1 thereon is a thin-film wiring board formed by a polyimide tape having a high heat resistance for example. It is covered (in its chip mounting area) with the insulating solder resist 2d except the connecting terminals 2c arranged on a peripheral edge portion thereof located on the chip supporting surface 2a side.

The semiconductor chip 1 is formed by silicon for example and is fixed to the chip supporting surface 2a of the tape substrate 2 by the die bonding layer 5, as shown in FIG. 5.

Further, as shown in FIG. 2, the sealing portion 6 shown in FIG. 1(a) comprises a chip sealing portion 6a which covers the main surface 1b of the semiconductor chip 1 and an outer side sealing portion 6b which covers outer side faces of the semiconductor chip. For example, the sealing portion 6 is formed by an integral combination of the chip sealing portion 6a and the outer side sealing portion 6b which are rendered integral with each other by a molding resin 10 (see FIG. 18) such as, for example, a thermosetting epoxy resin.

The bonding wires 4 for connecting the pads 1a on the semiconductor chip 1 with the corresponding connecting terminals 2c on the tape substrate 2 are gold wires for example.

Thermal expansion coefficients of the semiconductor chip (Si single crystal) and the molding resin 10 (e.g., epoxy resin) are as follows: Si single crystal=2.6 to 3.6 ($\times 10^{-6}/°$ C.), epoxy resin=10 to 70 ($\times 10^{-6}/°$ C.).

As shown in FIG. 4, a mounting substrate 8 for mounting the BGA 9 is formed, for example, by a glass-contained epoxy resin and its thermal expansion coefficient is approximately 20 to 26 ($\times 10^{-6}/°$ C.)

However, the values of thermal expansion coefficient of the above components are not limited to those shown above.

For example, if the warp of the entire package is to be diminished, taking curing and shrinkage of the molding resin 10 into account, it is suitable to use as the molding resin 10 a resin whose thermal expansion coefficient is smaller than that of the glass-contained epoxy resin which forms the wiring board.

Next, a method of manufacturing the semiconductor device, BGA 9, of this embodiment will be described below in accordance with the manufacturing process flows shown in FIGS. 11 and 12.

In connection with this embodiment the following description is given of the case where individual BGAs 9 are fabricated from a multi-substrate constituted by plural tape substrates 2 which are linked together.

In connection with this embodiment, moreover, descriptions will be given separately between the case where the insulating sheet member 5b as the second layer is a single insulating sheet-like layer formed of a polyimide resin (an assembling method using the insulating sheet member 5b is in this case designated a sheet affixing method) and the case where the insulating sheet member 5b is an adhesive layer obtained by pressing together an insulating epoxy resin thinly into a sheet with a roller or the like (an assembling method using the insulating sheet member 5b is in this case designated a method using a dicing tape).

Reference will first be made to the sheet affixing method shown in FIG. 11.

First, there is provided a semiconductor wafer 12 having plural semiconductor chip areas 12c on each of which is formed a desired semiconductor integrated circuit.

Thereafter, step S1 as a sheet affixing step shown in FIG. 9 is performed in which the insulating sheet member 5b as the second layer harder than the insulating adhesive layer 5a as the first layer is bonded temporarily to a back 12b which is the side opposite to a main surface 12a of the semiconductor wafer 12.

The aforesaid temporary bonding is a temporary heat-curing bonding (e.g., half-burning) because the insulating sheet member 5b used in the sheet affixing method is a single insulating sheet-like layer formed of a polyimide resin.

Further, the insulating sheet member 5b used in the sheet affixing method does not contain any ultraviolet curing material that cures and becomes less sticky upon exposure to ultraviolet ray shown in FIG. 11.

Thereafter, the insulating sheet member 5b temporarily bonded to the back 12b of the semiconductor wafer 12 and an ultraviolet curing type sticky layer 13a of a dicing tape 13 composed of the sticky layer 13a and a base material 13c are bonded together and the wafer is mounted thereon as in step S2 in FIG. 9 and FIG. 11.

More specifically, using the dicing tape 13 having the sticky layer 13a which contains an ultraviolet curing agent, the insulating sheet member 5b on the back 12b of the semiconductor wafer 12 is affixed onto the sticky layer 13a of the dicing tape 13.

Thereafter, the semiconductor wafer 12 is subjected to dicing shown in step S3 and FIG. 11 into individual pieces as semiconductor chips 1.

As shown in FIG. 9, the dicing is a full-dicing (full-cutting) using a blade 14, in which such other components than the dicing tape 13 as the semiconductor wafer 12 and the insulating sheet member 5b as the second layer affixed to the back 12b of the wafer are cut with the blade 14.

The thus-fragmented plural semiconductor chips 1 remain fixed on the dicing tape 13 without falling off.

Subsequently, there is performed die bonding shown in step S4 and FIG. 11.

First, UV radiation is performed using ultraviolet ray shown in FIG. 11.

More specifically, ultraviolet ray 11 is radiated to each semiconductor chip 1 from the back 13b of the dicing tape 13. As a result, the ultraviolet curing agent contained in the sticky layer 13a of the dicing tape 13 cures and the sticky layer 13a becomes less sticky.

In this state there is performed pickup shown in FIG. 11.

In the pickup step, each semiconductor chip 1 is thrust up with thrust-up needles 15 from the back 13b side of the dicing tape 13. As a result, since the sticky layer 13a is now less sticky, the insulating sheet member 5b affixed to the back 1c of the semiconductor chip 1 and the sticky layer 13a of the dicing tape 13 are separated from each other, as shown in FIG. 11.

That is, with the insulating sheet member 5b as the second layer left on the back 1c of the semiconductor chip 1, the chip is separated from the dicing tape 13.

On the other hand, the insulating paste layer 5c shown in FIG. 11, which upon curing becomes the insulating adhesive layer 5a as the first layer, is disposed (applied) beforehand on the chip supporting surface 2a as the first surface of the tape substrate 2 and the semiconductor chip 1 with the insulating sheet member 5b left on the back 1c is laminated onto the insulating paste layer 5c.

That is, as in the die bonding step shown in FIG. 11, the semiconductor chip 1 is disposed on the chip supporting surface 2a of the tape substrate 2 with the insulating paste layer 5c and the insulating sheet member 5b interposed between the tape substrate 2 and the semiconductor chip 1.

The insulating paste layer 5c is, for example, a pasty adhesive of a thermosetting epoxy resin.

Thereafter, heating is performed as shown in FIG. 11. In this heating step, the insulating paste layer 5c and the insulating sheet member 5b are heated to join the tape substrate 2 and the semiconductor chip 1 with each other. That is, the insulating paste layer 5c cures into the insulating adhesive layer 5a and at the same time the insulating sheet member 5b is heat-melted to join the insulating adhesive layer 5a and the semiconductor chip 1 with each other.

As a result, the semiconductor chip 1 is mounted to the tape substrate 2 by the die bonding layer 5 which comprises the insulating adhesive layer 5a as the first layer and the insulating sheet member 5b as the second layer overlying the first layer. Now, the die bonding step S4 shown in FIG. 9 is over.

Thereafter, wire bonding shown in step S5 in FIG. 10 is performed. In this wiring bonding step, the pads 1a on the semiconductor chip 1 and corresponding connecting terminals 2c on the tape substrate 2 are connected together with wires 4 (conductive members).

The wire bonding step is followed by molding step shown in step S6, in which the semiconductor chip 1 and the wires 4 are sealed with the molding resin 10 shown in FIG. 18.

In this way a sealing portion 6 comprising a chip sealing portion 6a and an outer side sealing portion 6b is formed integrally.

In this molding step, the resin sealing is performed by a transfer molding method using the molding resin 10 which is, for example, a thermosetting epoxy resin.

Subsequently, the back 2b (the side opposite to the chip supporting surface 2a) of the tape substrate 2 after molding is faced up, then solder balls are fed respectively to the bump lands 2g formed on the back 2b, and thereafter ball mounting shown in step S7 in FIG. 10 is perfomed in which the solder balls 3 are melted by passing through a reflow furnace or the like to mount the solder balls 3 as external terminals.

Thereafter, tape cutting of step S7 is performed in which the tape-like multi-substrate is cut into individual BGA areas for separation into individual BGAs 9.

As a result, there can be obtained such a BGA 9 as shown in FIGS. 1 and 2.

By thus providing the ultraviolet curing type sticky layer 13a separately from the insulating sheet member 5b, the material selectivity of the insulating sheet member 5b is improved. Particularly, in this embodiment, by using a polyimide resin sheet not containing any untraviolet curing material as the insulating sheet member 5b, the insulating sheet member can be kept less hygroscopic and it is possible to improve the reflow characteristic of the BGA 9.

The following description is now provided about the case where the manufacture of BGA 9 is carried out by the method using a dicing tape which is shown in FIG. 12.

In the method using a dicing tape, the insulating sheet member 5b as the second layer is an adhesive layer formed by pressing together an insulating epoxy resin into a thin sheet with use of a roller or the like, the adhesive layer being formed beforehand on the surface of the dicing tape 13.

More specifically, as shown in FIG. 12, the dicing tape 13 used in the method which uses the dicing tape comprises the base material 13c and the insulating sheet member 5b as the above adhesive layer. The insulating sheet member 5b contains a sticky material and a die bonding material.

The insulating sheet member 5b further contains an ultraviolet curing material which cures and becomes less sticky upon exposure to ultraviolet ray 11.

First, there is provided a semiconductor wafer 12 having plural semiconductor chip areas 12c with a desired semiconductor integrated circuit formed on each of the chip areas.

Thereafter, wafer mounting shown in step S2 in FIG. 9 and FIG. 12 is performed in which the back 12b of the semiconductor wafer 12 and the insulating sheet member 5b as the second layer formed on the surface of the dicing tape 13 and harder than the insulating adhesive layer 5a as the first layer to be described later are bonded together.

To be more specific, using the dicing tape 13 with the insulating sheet member 5b formed on the surface thereof, the insulating sheet member 5b being an adhesive layer containing an ultraviolet curing agent, the back 12b of the semiconductor wafer 12 is affixed onto the insulating sheet member 5b of the dicing tape 13.

Then, the semiconductor wafer 12 is subjected to dicing shown in step S3 in FIG. 9 and FIG. 12 into individual semiconductor chips 1.

First, UV radiation is performed using ultraviolet ray 11 shown in FIG. 12.

More particularly, ultraviolet ray 11 is radiated to each semiconductor chip area 12c from the back 13b side of the dicing tape 13. As a result, the ultraviolet curing agent contained in the insulating sheet member 5b of the dicing tape 13 cures and the insulating sheet 5b becomes less sticky.

In the insulating sheet member 5b, if the concentration of the ultraviolet curing agent is made low to weaken the curing reactivity against ultraviolet ray, it becomes possible to let only the portion present on the base material side of the insulating sheet member 5b cure upon radiation of the ultraviolet ray 11 from the back 13b side of the dicing tape 13.

By thus leaving an uncured portion of the insulating sheet member 5b it is possible to enhance the bonding force between the insulating sheet member 5b and the insulating adhesive layer 5a. This is because in a heat treatment performed for curing the insulating paste layer 5c during a later die bonding step the insulating sheet member 5b also melts and cures, thereby making it possible to improve the adhesion of the interface between the insulating paste layer 5c and the insulating sheet member 5b.

Thereafter, dicing shown in FIG. 12 is performed. The dicing is a full-dicing (full-cutting) using the blade 14 shown in FIG. 9, in which the semiconductor wafer 12 and the insulating sheet member 5b affixed to the back 12b of the wafer are cut with the blade 14.

The thus-diced plural semiconductor chips 1 remain fixed onto the dicing tape without falling off.

After the dicing, pickup shown in FIG. 12 is performed in this state.

In the pickup step, the insulating sheet member 5b of the dicing tape 13 on the base material 13c side is less sticky (an ultraviolet cured layer 5d is formed), so by thrusting up the semiconductor chip 1 with thrust-up needles 15 from the back 13b side of the dicing tape 13, the insulating sheet member 5b of the dicing tape 13 and the base material 13c become separated from each other, as shown in FIG. 12.

That is, with the insulating sheet member 5b as the second layer disposed (allowed to remain) on the back 1c of the semiconductor chip 1, the insulating sheet member 5b and the base material 13c are separated from each other.

At this time, the ultraviolet cured layer 5d is formed at an exposed surface side of the insulating sheet member 5b.

Then, die bonding shown in step S4 in FIG. 9 and FIG. 12 is performed.

First, the insulating paste layer 5c shown in FIG. 12 which on curing becomes the insulating adhesive layer 5a as the first layer is disposed (applied) on the chip supporting surface 2a as the first surface of the tape substrate 2, and the semiconductor chip 1 with the insulating sheet member 5b left thereon is laminated onto the insulating paste layer 5c.

That is, as in the die bonding shown in FIG. 12, the semiconductor chip 1 is disposed on the chip supporting surface 2a of the tape substrate 2 while interposing the insulating paste layer 5c and the insulating sheet member 5b between the tape substrate 2 and the semiconductor chip 1.

The insulating paste layer 5c is, for example, a paste-like adhesive of a thermosetting epoxy resin.

Thereafter, heating shown in FIG. 12 is performed. In this heating step, the insulating paste layer 5c and the insulating sheet member 5b are heated to join the tape substrate 2 and the semiconductor chip 1 with each other. On heating, the ultraviolet cured layer 5d of the insulating sheet member 5b melts out, and by virtue of adhesive properties of the insulating sheet member 5b and the insulating paste layer 5c both are bonded together.

Further, the insulating paste layer 5c cures into the porous insulating adhesive layer 5a and the insulating sheet member 5b as the second layer harder than the insulating adhesive layer 5a as the first layer overlies the insulating adhesive layer.

Consequently, the semiconductor chip 1 becomes mounted to the tape substrate 2 by both insulating adhesive layer 5a as the first layer and insulating sheet member 5b as the overlying second layer. Now, the die bonding step S4 shown in FIG. 9 is over.

As to the assembling steps subsequent to die bonding in the BGA 9 manufacturing method using the dicing tape, they are the same as in the sheet affixing method, so repeated explanations thereof will here be omitted.

According to the semiconductor device (BGA 9) and the method of manufacturing the same of this embodiment there are obtained the following functions and effects.

In the BGA 9 of this embodiment, by forming the insulating die bonding layer 5 between the semiconductor chip 1 and the tape substrate 2 as a multi-layer, it is possible to improve the so-called resin balance on the surface and back of the semiconductor chip 1 (i.e., L≈M can be attained).

The porous, insulating adhesive layer 5a not only possesses the function of releasing moisture and gas to the exterior at the time of reflow but also is every small in diameter and has pores of a complicated structure, thereby making it possible to prevent the entry of molting resin 10 into the porous portion.

A comparative BGA 16 shown in FIG. 13 is of a comparative structure, in which a die bonding material 17 for fixing a semiconductor chip 1 is of a single-layer structure.

Assembly of the comparative BGA 16 is performed as shown in FIGS. 9 and 10. First, wafer mounting is performed in which a semiconductor wafer 12 is bonded to a dicing tape 13, followed by successive execution of dicing with blade 14, die bonding, wire bonding, molding, and ball mounting/tape cutting.

In the BGA 9 according to the embodiment of the invention, shown in FIG. 4, two insulating layers, i.e., the insulating adhesive layer 5a (first layer) and the insulating sheet member 5b (second layer) harder than the insulating adhesive layer are disposed as the die bonding layer 5 between the semiconductor chip 1 and the tape substrate 2, whereby the insulating die bonding layer 5 comprising the insulating adhesive layer 5a and the insulating sheet member 5 and located between the semiconductor chip 1 and the tape substrate 2 can be made thick easily.

Since the die bonding layer 5 on the back side of the semiconductor chip 1 can thus be formed thick, it is possible to improve the so-called resin balance on the surface and the back of the semiconductor chip 1.

As a result, it is possible to diminish a difference in shrinkage factor among the chip sealing portion 6a on the semiconductor chip 1, the semiconductor chip, the die bonding layer 5, and the mounting substrate 8.

That is, as shown in FIG. 5, the chip sealing portion 6a and the mounting substrate 8 are at a maximum shrinkage indicated at 18, while the semiconductor ship is at a minimum shrinkage indicated at 19.

Therefore, in the BGA 9 according to this embodiment shown in FIG. 5, the die bonding layer 5 comprising the insulating adhesive layer 5a and the insulating sheet member 5b and located on the back 1c side of the semiconductor chip 1 can be formed thick, so that it is possible to diminish (relax) a stress concentration indicated at 20 on both package-side bonded portion 3a and mounting substrate 8-side bonded portion 3a of each solder ball 3. As a result, it is possible to diminish defective connections of solder balls 3 in a temperature cycle test for example.

Consequently, it is possible to improve the mounting temperature cyclicity (life).

Particularly it is possible to diminish the stress concentration 20 on the bonded portions 3a of the solder balls 3 (the solder ball 3 indicated with arrow 20) arranged near peripheral edge portions of the semiconductor chip 1, whereby the temperature cyclicity can be improved.

FIGS. 15, 16 and 17(a), (b) illustrate the state of stress concentration 20 at bonded portions 3a of a solder ball 3. As shown therein, the stress concentration 20 occurs at bonded portions 3a of a solder ball 3 due to a difference in thermal expansion between the semiconductor chip 1 and the mounting substrate 8 and breakage occurs as indicated at 20 in FIG. 17(b).

In the BGA 9 of this embodiment, however, as shown in FIG. 5, since the die bonding layer 5 comprising the insulating adhesive layer 5a and the insulating sheet member 5b can be formed thick, it is possible to diminish the stress concentration 20 on the bonded portions 3a of the solder ball 3, whereby the mounting temperature cyclicity (life) can be improved.

In the BGA 9 of this embodiment, moreover, out of the insulating adhesive layer 5a and the insulating sheet member 5b in the die bonding layer 5, the underlying insulating adhesive layer 5a is a porous layer formed by curing the paste material (the insulating paste layer 5c), so that air such as gas produced within the BGA 9 can be released to the exterior through the insulating adhesive layer 5a.

Therefore, it is possible to improve the reflow characteristic of the BGA 9.

The reflow characteristic can be further improved by forming the vent hole 2e as an air vent portion in the tape substrate 2.

That is, since a porous layer formed by curing the paste material (insulating paste layer 5c) is disposed on a lower side, the reflow characteristic can be improved without impairing the effect of the vent hole 2e.

Further, since the insulating die bonding layer 5 can be formed thick on the back 1c of the semiconductor chip 1 and the resin balance on the surface and back sides of the semiconductor chip can be improved, it is possible to diminish warping of the package when the molding resin cures.

That is, the amount of warp in the BGA 9 can be made small as indicated at 22 in FIG. 4.

Consequently, the mounting surface of the solder balls 3 can be improved in its flatness and it is thereby possible to diminish defective connections of the solder balls 3 when mounted on the mounting substrate 8.

As a result, it is possible to improve the mounting performance of the BGA 9.

In the case of the comparative BGA 16, as shown in FIG. 14, since it is of a single-layer structure using the die bonding material 17, the amount of warp is large as indicated at 23 and there occur defective connections of solder balls 3 when mounted on the mounting substrate 8.

In the molding step for the comparative BGA 16, as shown in FIG. 18, at the time of filling a cavity 24a of a mold 24 with the molding resin, the adhesive layer on the back 1c side of the semiconductor chip 1 is formed by a thick coating (incl. a multi-stage coating) of only the die bonding material 17, so that the elastic modulus thereof is small and hence a resin injection pressure indicated at 25 causes the semiconductor chip 1 to either sink or become larger in its displacement quantity, thus leading to a crack of the chip as indicated at 26.

In the BGA 9 of this embodiment, however, the die bonding layer 5 is of a multi-layer structure and the elastic modulus of the insulating adhesive layer 5a is smaller than that of the insulating sheet member 5b, so even if the injection pressure 25 of the molding resin 10 is imposed on the semiconductor chip 1 at the time of molding, it is possible to decrease the amount of sink of the chip because the insulating sheet member 5b as the second layer is hard. As a result, it is possible to prevent buckling of the semiconductor chip 1.

Consequently, in the manufacture of the BGA 9, it is possible to prevent cracking of the semiconductor chip 1 caused by the resin injection pressure or an internal stress based on curing and shrinkage of the resin.

In the comparative BGA 16 shown in FIG. 13, if the die bonding material 17 is formed as a sheet, as shown in FIG. 19, it is impossible to absorb concaves and convexes of the chip supporting surface 2a of the tape substrate 2, with consequent formation of non-bonded portions 27 between the die bonding material 17 and the tape substrate 2, thus leading to deterioration in flatness of the die bonding surface.

In the BGA 9 of this embodiment, the insulating adhesive layer 5a formed by curing the paste material (insulating paste layer 5c) is used as the first layer which is disposed on a lower side and therefore, as shown in FIG. 6, concaves and convexes of the chip supporting surface 2a of the tape substrate 2 can be absorbed by the insulating adhesive layer 5a, whereby not only the adhesion between the insulating adhesive layer 5a and the tape substrate 2 can be improved but also the flatness of the die bonding surface can be ensured.

Although the invention accomplished by the present inventor has been described above concretely by way of an embodiment thereof, it goes without saying that the present invention is not limited to the above embodiment, but that various modifications may be made within the scope not departing from the gist of the present invention.

For example, although in the BGA 9 of the above embodiment the die bonding layer 5 onto which the semiconductor chip 1 is fixed comprises the insulating adhesive layer 5a formed by curing the paste material and the insulating sheet member 5b, there also is included in the present invention such a BGA of a modification as shown in FIG. 7 in which a soft, porous sheet member 5e impregnated with a thermosetting adhesive is used instead of the insulating adhesive layer 5a formed by curing the insulating paste layer 5c. In other words, in place of applying the insulating paste layer 5c in die bonding there may be adopted a method wherein after affixing the porous sheet member 5e to the tape substrate 2, a semiconductor chip 1 with an insulating sheet member 5b formed on its back 1c is disposed on the porous sheet member 5e, followed by heat treatment to bond the semiconductor chip.

According to such a structure or manufacturing method, there is little fear that the adhesive may leak out from the vent hole 2e, so that the porous layer can be formed thicker. As a result, it is possible to further improve the reflow characteristic, mounting temperature cyclicity and mounting performance and diminish the stress imposed on the semiconductor chip 1.

Moreover, by adjusting the amount of the adhesive to be impregnated into the porous sheet member 5e to beforehand to such a degree as does not impregnate into the whole of the porous sheet member, it is possible to prevent the water and gas permeability of the porous sheet member 5e from being impaired.

Further, in the step of affixing the porous sheet member 5e to the tape substrate 2, if the amount of the adhesive impregnated into the adhesive impregnated layer 5f on the tape substrate 2 side is adjusted larger than that on the semiconductor chip 1 side, the adhesive will exude into concaves between wiring lines on the tape substrate 2 like adhesive exuded portions 5g, thereby preventing gaps from being left between wiring lines.

Although in the above embodiment and modification shown in FIG. 7, the die bonding layer 5 is of an insulating two-layer structure, the number of layers is not specially limited insofar as it is two or more.

In the above embodiment, on the chip supporting surface 2a side of the tape substrate 2, the bump lands 2g other than the connecting terminals 2c connected with the wires 4 are covered and insulated with the solder resist 2d. However, if the insulation between the semiconductor chip 1 and the wiring lines and bump lands 2g on the tape substrate 2 can be ensured to a satisfactory extent by the insulating sheet member 5b and the porous sheet member 5e and if a dam 2h of a sufficient height can be formed by the cylindrical conductor film 29, there may be adopted a such a construction as a modification shown in FIG. 8 in which the porous sheet member 5e is bonded directly to the chip supporting surface 2a without the provision of the solder resist 2d.

In this case, the concaves between wiring lines on the tape substrate 2 becomes smaller in depth, so even if the amount of the adhesive impregnated into the porous sheet member 5e is made small, the gaps between wiring lines can be filled up more effectively by the adhesive which has exuded like the adhesive exuded portions 5g.

More specifically, in the BGA 9 shown as a modification in FIG. 8, bump lands 2g and connecting terminals 2c both disposed on a chip supporting surface 2a of a tape substrate 2 are plated with gold, of which the bump lands 2g (incl.

wiring lines) are covered with an insulating adhesive layer 5a as a first layer on the chip supporting surface 2a side.

In this case, even if the insulating adhesive layer 5a as the first layer is thin, since the overlying second layer is an insulating sheet member 5b, it is possible to ensure insulation between bump lands 2g and also between the bump lands and the semiconductor chip 1.

Consequently, it is possible to omit using the solder resist 2d and standardize the material used for the die bonding layer 5, whereby the cost of the BGA 9 can be reduced.

Although in the above embodiment the substrate which supports the semiconductor chip 1 is the tape substrate 2 (wiring board) formed of a polyimide resin, the tape substrate 2 may be formed of a material other than polyimide, e.g., a glass-contained epoxy resin.

Although in the above embodiment individual semiconductor devices (BGAs 9) are fabricated from a multi-substrate having plural tape substrates 2, such a multi-substrate need not always be used. A tape substrate 2 pre-cut and separated for a single BGA 9 may be used for the fabrication of BGA 9.

Although the semiconductor device of the above embodiment is a Fan-In/Fan-Out type BGA 9 wherein plural solder balls 3 are arranged in areas corresponding to inside and outside of the semiconductor chip 1, the semiconductor device may be a Fan-In type or a Fan-Out type or may be another type of a semiconductor device such as a CSP (Chip Scale Package) of a chip size.

Although the semiconductor device of the above embodiment is a BGA type semiconductor device having solder balls 3 on the back 2b of the tape substrate 2, the present invention may also be applied to an LGA (Land Grip Array) type semiconductor device not having solder balls 3 as external electrodes.

Particularly in an lGA type of a semiconductor device, the relaxation of stress induced between the semiconductor device and the mounting substrate 8 is an important problem and the application of the present invention is very effective in improving the mounting performance and the mounting temperature cyclicity.

The following is a brief description of effects attained by typical inventions out of those disclosed herein.

(1) By using a thick multi-layer structure as the insulating die bonding layer disposed between the semiconductor chip and the wiring board, it is possible to improve the so-called resin balance on the surface and back of the semiconductor chip. As a result, it is possible to diminish a difference in shrinkage factor among the chip sealing portion formed on the semiconductor chip, the semiconductor chip, the die bonding layer, and the mounting substrate.

(2) Since the die bonding layer comprising the first and second layers and formed on the back side of the semiconductor chip can be formed thick, it is possible to diminish the concentration of stress on both package-side bonded portions and mounting substrate-side bonded portions of bump electrodes, with the result that it is possible to diminish defective connections of bump electrodes in a temperature cycle test for example. Consequently, it is possible to improve the mounting temperature cyclicity. Particularly, the concentration of stress on the bonded portions of bump electrodes arranged near peripheral edges of the semiconductor chip can be diminished, resulting in that the temperature cyclicity can be improved.

(3) Of the first and second layers as constituent layers of the die bonding layer, the underlying first layer is a porous layer formed by curing a paste material, so that the air generated within the semiconductor device can be allowed to escape to the exterior through the first layer. Accordingly, it is possible to improve the reflow characteristic.

(4) By forming a vent hole as an air vent portion in the wiring board it is possible to further improve the reflow characteristic. More particularly, since a porous layer formed by curing a paste material is disposed on a lower side, the reflow characteristic can be improved without impairing the effect of the vent hole.

(5) Since the insulating die bonding layer can be formed thick on the back side of the semiconductor chip and the resin balance on the surface and the back of the chip can be improved thereby, it is possible to diminish the warp of package when the molding resin cures. Consequently, it is possible to improve the flatness of the bump electrode mounting surface, whereby it is possible to diminish defective connections of the bump electrodes when mounted on the mounting substrate, thus making it possible to improve the mounting performance.

(6) The elastic modulus of the insulating adhesive layer as the first layer in the die bonding layer is smaller than that of the insulating sheet member as the second layer, so even if the molding resin injection pressure is imposed on the semiconductor chip during molding, it is possible to decrease the amount of sink of the semiconductor chip and hence possible to prevent buckling of the chip. Thus, it is possible to prevent cracking of the chip caused by the resin injection pressure.

(7) In the case where the underlying first layer in the die bonding layer is formed by curing a paste material, concaves and convexes on the chip supporting surface of the wiring board can be absorbed by the paste material, so that the adhesion between the first layer and the wiring board can be improved and it is possible to ensure flatness of the die bonding surface.

What is claimed is:

1. A method of manufacturing a semiconductor device comprising a wiring board, a semiconductor chip disposed over the wiring board, an insulating, first layer disposed between the wiring board and the semiconductor chip, and an insulating, second layer disposed between the semiconductor chip and the insulating, first layer, the method comprising the steps of:

provinding the wiring board;

bonding the wiring board and the semiconductor chip to each other while interposing the first and second layers therebetween, the second layer being formed harder than the first layer;

connecting a surface electrode on the semiconductor chip with a corresponding connecting terminal on the wiring board with each other through a conductive member; and forming a sealing portion by sealing the semiconductor chip and the conductive member with a molding resin.

2. A method of manufacturing the semiconductor chip according to claim 1, wherein after the formation of the sealing portion, a plurality of bump electrodes as external terminals are formed on the side opposite to the first surface of the wiring board with the semiconductor chip bonded thereto.

3. A method of manufacturing a semiconductor device comprising a wiring board, a semiconductor chip disposed over the wiring board, an insulating, first layer disposed between the wiring board and the semiconductor chip, and an insulating second layer disposed between the semiconductor chip and the insulating, first layer, the method comprising the steps of:

providing a semiconductor wafer with a plurality of semiconductor chip areas formed thereon;

bonding the semiconductor wafer and a dicing tape to each other while interposing the second layer between the side opposite to a main surface of the semiconductor wafer and the dicing tape, the second layer being formed harder than the first layer;

dicing the semiconductor wafer into individual pieces as semiconductor chips and separating each of the individual semiconductor chips and the dicing tape from each other while allowing the second layer to remain on the side opposite to a main surface of the semiconductor chip;

bonding the wiring board and the semiconductor chip to each other while interposing the first and second layers therebetween;

connecting a surface electrode on the semiconductor chip with a corresponding connecting terminal on the wiring board through a conductive member; and sealing the semiconductor chip and the conductive member with a molding resin to form a sealing portion.

4. A method of manufacturing a semiconductor device comprising a wiring board, a semiconductor chip disposed over the wiring board, an insulating, first layer disposed between the wiring board and the semiconductor chip, and an insulating, second layer disposed between the semiconductor chip and the insulating, first layer, the method comprising the steps of:

providing a semiconductor wafer with a plurality of semiconductor chip areas formed thereon;

bonding the semiconductor wafer and a dicing tape to each other while interposing an insulating sheet member as the second layer between the side opposite to a main surface of the semiconductor wafer and the dicing tape, the insulating sheet member as the second layer being formed harder than an insulating paste layer as the first layer;

dicing the semiconductor wafer into individual pieces as semiconductor chips and separating each of the individual semiconductor chips and the dicing tape from each other while allowing the insulating sheet member to remain on the side opposite to a main surface of the semiconductor chip;

disposing the insulating paste layer on a first layer of the wiring board, further disposing the insulating sheet member over the insulating paste layer, and bonding the wiring board and the semiconductor chip to each other while interposing the insulating paste layer and the insulating sheet member therebetween;

connecting a surface electrode on the semiconductor chip with a corresponding connecting terminal on the wiring board through a conductive member; and sealing the semiconductor chip and the conductive member with a molding resin to form a sealing portion.

5. A method of manufacturing a semiconductor device comprising a wiring board, a semiconductor chip disposed over the wiring board, an insulating, first layer disposed between the wiring board and the semiconductor chip, and an insulating, second layer disposed between the semiconductor chip and the insulating, first layer, the method comprising the steps of:

providing a semiconductor wafer with a plurality of semiconductor chip areas formed thereon;

bonding the side opposite to a main surface of the semiconductor wafer and a dicing tape to each other, the dicing tape having the second layer which is formed harder than an insulating paste layer as the first layer;

dicing the semiconductor wafer into individual pieces as semiconductor chips and separating each of the individual semiconductor chips and the dicing tape from each other while allowing the second layer to remain on the side opposite to a main surface of the semiconductor chip;

disposing the insulating paste layer on a first surface of the wiring board, disposing the second layer over the insulating paste layer, and interposing the insulating paste layer and the second layer between the wiring board and the semiconductor chip;

heating the insulating paste layer and the second layer and thereby bonding the wiring board and the semiconductor chip to each other;

connecting a surface electrode on the semiconductor chip with a corresponding connecting terminal on the wiring board through a conductive member; and sealing the semiconductor chip and the conductive member with a molding resin to form a sealing portion.

6. A method of manufacturing a semiconductor device according to claim 5, wherein the second layer contains an ultraviolet curing material, and ultraviolet ray is radiated to the second layer before the dicing step to make the second layer less sticky.

7. A method of manufacturing a semiconductor device comprising a wiring board, a semiconductor chip disposed over the wiring board, an insulating, first layer disposed between the wiring board and the semiconductor chip, and an insulating, second layer disposed between the semiconductor chip and the insulating, first layer, the method comprising the steps of:

providing a semiconductor wafer with a plurality of semiconductor chip areas formed thereon;

temporarily bonding the side opposite to a main surface of the semiconductor wafer and an insulating sheet member as the second layer to each other, the insulating sheet member as the second layer being formed harder than an insulating paste layer as the first layer;

bonding the insulating sheet member bonded temporarily to the side opposite to the main surface of the semiconductor wafer and a dicing tape to each other, the dicing tape having an ultraviolet curing type sticky layer;

dicing the semiconductor wafer into individual pieces as semiconductor chips and separating each of the individual semiconductor chips and the dicing tape from each other while allowing the insulating sheet member to remain on the side opposite to a main surface of the semiconductor chip;

disposing the insulating paste layer on a first surface of the wiring board, disposing the insulating sheet member over the insulating paste layer, and interposing the insulating paste layer and the insulating sheet member between the wiring board and the semiconductor chip;

heating the insulating paste layer and the insulating sheet member and thereby bonding the wiring board and the semiconductor chip to each other;

connecting a surface electrode on the semiconductor chip with a corresponding connecting terminal on the wiring board through a conductive member; and sealing the semiconductor chip and the conductive member with a molding resin to form a sealing portion.

8. A method of manufacturing a semiconductor device according to claim 7, wherein the insulating sheet member does not contain any ultraviolet curing material and it is affixed to the side opposite to the main surface of the semiconductor wafer, then after the dicing step, ultraviolet ray is radiated to the insulating sheet member to make the insulating sheet member less sticky, and thereafter the semiconductor chip and the dicing tape are separated from each other while allowing the insulating sheet member to remain on the side opposite to the main surface of the semiconductor chip.

9. A method of manufacturing a semiconductor device, comprising the steps of:

providing a semiconductor chip with an insulating sheet member affixed to a back thereof;

disposing the semiconductor chip on a wiring board through an insulating paste layer and the insulating sheet member;

performing a heat treatment to cure the insulating paste layer and make it porous; and sealing upper and side portions of the semiconductor chip with resin.

10. A method of manufacturing a semiconductor device according to claim 9, wherein the insulating paste layer contains an epoxy resin as a principal component.

11. A method of manufacturing a semiconductor device according to claim 9, wherein the insulating sheet member after the heat treatment step is harder than the cured paste layer after the heat treatment step.

* * * * *